(12) United States Patent
Ohsawa

(10) Patent No.: US 7,440,329 B2
(45) Date of Patent: Oct. 21, 2008

(54) FLOATING BODY CELL (FBC) MEMORY DEVICE WITH A SENSE AMPLIFIER FOR REFRESHING DUMMY CELLS

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 11/625,957

(22) Filed: Jan. 23, 2007

(65) Prior Publication Data

US 2007/0177443 A1 Aug. 2, 2007

(30) Foreign Application Priority Data

Feb. 2, 2006 (JP) ............................... 2006-025723

(51) Int. Cl.
*G11C 16/28* (2006.01)
(52) U.S. Cl. ............................. 365/185.2; 365/185.21; 365/185.25; 365/185.23; 365/185.26
(58) Field of Classification Search ............ 365/185.26, 365/185.2, 185.21, 185.25, 185.23, 185.18
See application file for complete search history.

(56) References Cited

U.S. PATENT DOCUMENTS 7,145,811 B2 12/2006 Ohsawa

2007/0195626 A1* 8/2007 Kim et al. .................... 365/210
2008/0049529 A1* 2/2008 Ohsawa ....................... 365/205

FOREIGN PATENT DOCUMENTS

EP 0678919 A1 * 10/1995
JP 2007-207358 A * 8/2007

OTHER PUBLICATIONS

Takashi Ohsawa, et al., "An 18.5ns 128Mb SOI DRAM with a Floating Body Cell", ISSCC 2005, Digest of Technical Papers, Session 25, Dynamic Memory, 25.1, Feb. 2005, 3 Pages.

* cited by examiner

*Primary Examiner*—Andrew Q Tran
(74) *Attorney, Agent, or Firm*—Oblon, Spivak, McClelland, Maier & Neustadt, P.C.

(57) ABSTRACT

This disclosure concerns a semiconductor memory including memory cells; a first dummy cell and a second dummy cell generating a reference potential and storing first data and second data of mutually opposite polarities, respectively; word lines; a first and a second dummy word lines connected to gates of the first and the second dummy cells; a pair of bit lines; and a sense amplifier provided for the pair of bit lines, the sense amplifier detecting the first data using the second data as a reference or detecting the second data using the first data as a reference in a refresh operation of the first and the second dummy cells.

16 Claims, 19 Drawing Sheets

WORD DRIVE SIGNAL GENERATOR

WORD DRIVE SIGNAL GENERATOR

DWL DRIVER

DWL DRIVER

AVERAGING-SIGNAL GENERATOR

AVERAGING-SIGNAL GENERATOR

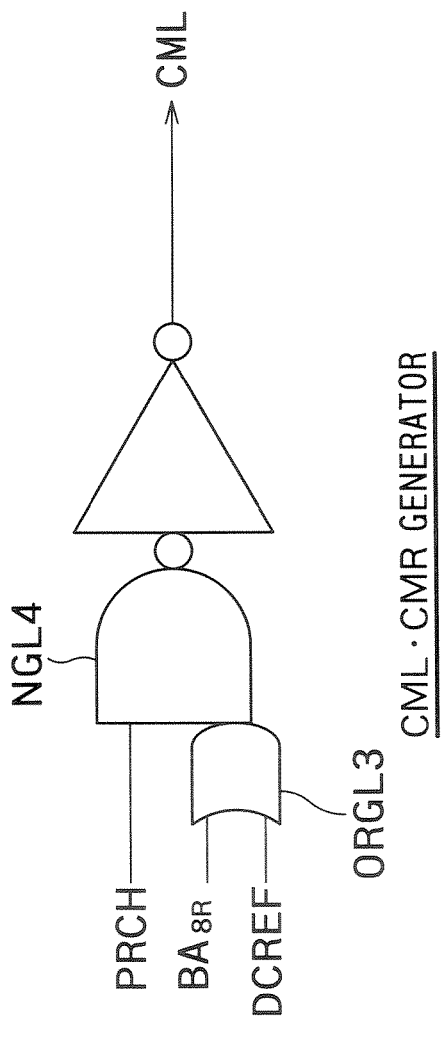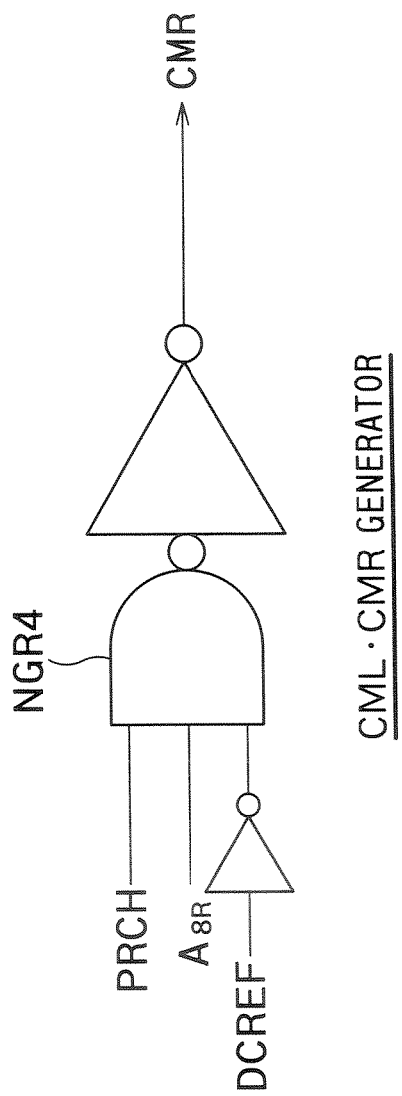
FIG. 9A  CML·CMR GENERATOR
FIG. 9B  CML·CMR GENERATOR

OPERATION OF READING DATA FROM A MEMORY CELL

FLOATING BODY CELL (FBC) MEMORY DEVICE WITH A SENSE AMPLIFIER FOR REFRESHING DUMMY CELLS

CROSS-REFERENCE TO RELATED APPLICATION

This application is based upon and claims the benefit of priority from the prior Japanese Patent Application No. 2006-25723, filed on Feb. 2, 2006, the entire contents of which are incorporated herein by reference.

BACKGROUND OF THE INVENTION

1. Field of the Invention

The present invention relates to a semiconductor memory device, and relates, for example, to a FBC (Floating Body Cell) memory that stores information by accumulating majority carriers in a floating body of a field-effect transistor (FET).

1. Related Art

In recent years, there is an FBC memory device as a semiconductor memory device expected as a memory that replaces a DRAM. The FBC memory device has an FET equipped with a floating body (hereinafter, also "body area") on an SOI (Silicon On Insulator) substrate, and stores data "1" or data "0" depending on the number of majority carriers accumulated in this body area. For example, a memory cell MC is an N-type NET, and a state that the number of holes within the body area is large is set as data "1" and a state that the number of holes is small is set as data "0". The FBC memory device is superior to an 1T (Transistor)-1C (Capacitor)-type DRAM in that the FBC memory device can be made fine and can increase a memory capacity.

The FBC memory device generates a reference current between a current flowing "1" cell and a current flowing "0" cell, and compares this reference current with the current to identify whether this data is "1" or "0". As a system that generates a reference current, a dummy cell system is available. The dummy cell system generates an intermediate current between a current flowing the memory cell storing data "1" and a current flowing the memory cell storing data "0" as a reference current from a pair of a dummy cell storing data "1" and a dummy cell storing data "0".

The dummy cell system has required a writing circuit exclusive for dummy cells, to write data into dummy cells and to refresh dummy cells. Therefore, a size of a memory area becomes large, and it is difficult to further decrease the size of the FBC memory device.

SUMMARY OF THE INVENTION

A semiconductor memory device according to an embodiment of the present invention comprises memory cells including floating bodies in an electrically floating state and storing data based on the number of majority carriers within the floating bodies; a first dummy cell and a second dummy cell generating a reference data which becomes a data detection reference at the time of detecting the data of the memory cells and storing first data and second data of mutually opposite polarities, respectively; word lines connected to gates of the memory cells; a first dummy word line and a second dummy word line connected to a gate of the first dummy cell and a gate of the second dummy cell, respectively; a pair of bit lines connected to sources or drains of the memory cells; and a sense amplifier provided for the pair of bit lines, the sense amplifier detecting the first data using the second data as the reference data or detecting the second data using the first data as the reference data in a refresh operation of the first and the second dummy cells, the refresh operation being an operation in which data stored in the first or the second dummy cell is read, then the data is written back to the same dummy cell.

A semiconductor memory device according to an embodiment of the present invention comprises memory cells including floating bodies in an electrically floating state and storing data based on the number of majority carriers within the floating bodies; a first dummy cell and a second dummy cell generating a reference current which becomes a data detection reference at the time of detecting the data of the memory cells and storing first data and second data of mutually opposite polarities, respectively; word lines connected to gates of the memory cells; a first dummy word line and a second dummy word line connected to a gate of the first dummy cell and a gate of the second dummy cell, respectively; a pair of bit lines connected to sources or drains of the memory cells; a first sense amplifier provided for the pair of bit lines and sensing data of one of the memory cells; a pair of sense nodes provided within the first sense amplifier; and two transfer gates provided between the pair of sense nodes and the pair of bit lines and controlled by different signals, wherein at the time of writing the first and the second data into the first and the second dummy cells or at the time of a refresh operation of the first and the second dummy cells, one of the two transfer gates becomes off and the other transfer gate becomes on, for setting potentials of the pair of sense nodes asymmetrical, and the first sense amplifier simultaneously writes the first data and the second data into the first dummy cell and the second dummy cell, respectively, using a difference between potentials of the pair of sense nodes.

BRIEF DESCRIPTION OF THE DRAWINGS

FIG. 9A and FIG. 9B show circuits that generate signals CML and CMR for controlling the current mirror shown in FIG. 3;

DETAILED DESCRIPTION OF THE INVENTION

Embodiments of the present invention will be explained below with reference to the accompanying drawings. The present invention is not limited to the embodiments.

First Embodiment

Figure 1:
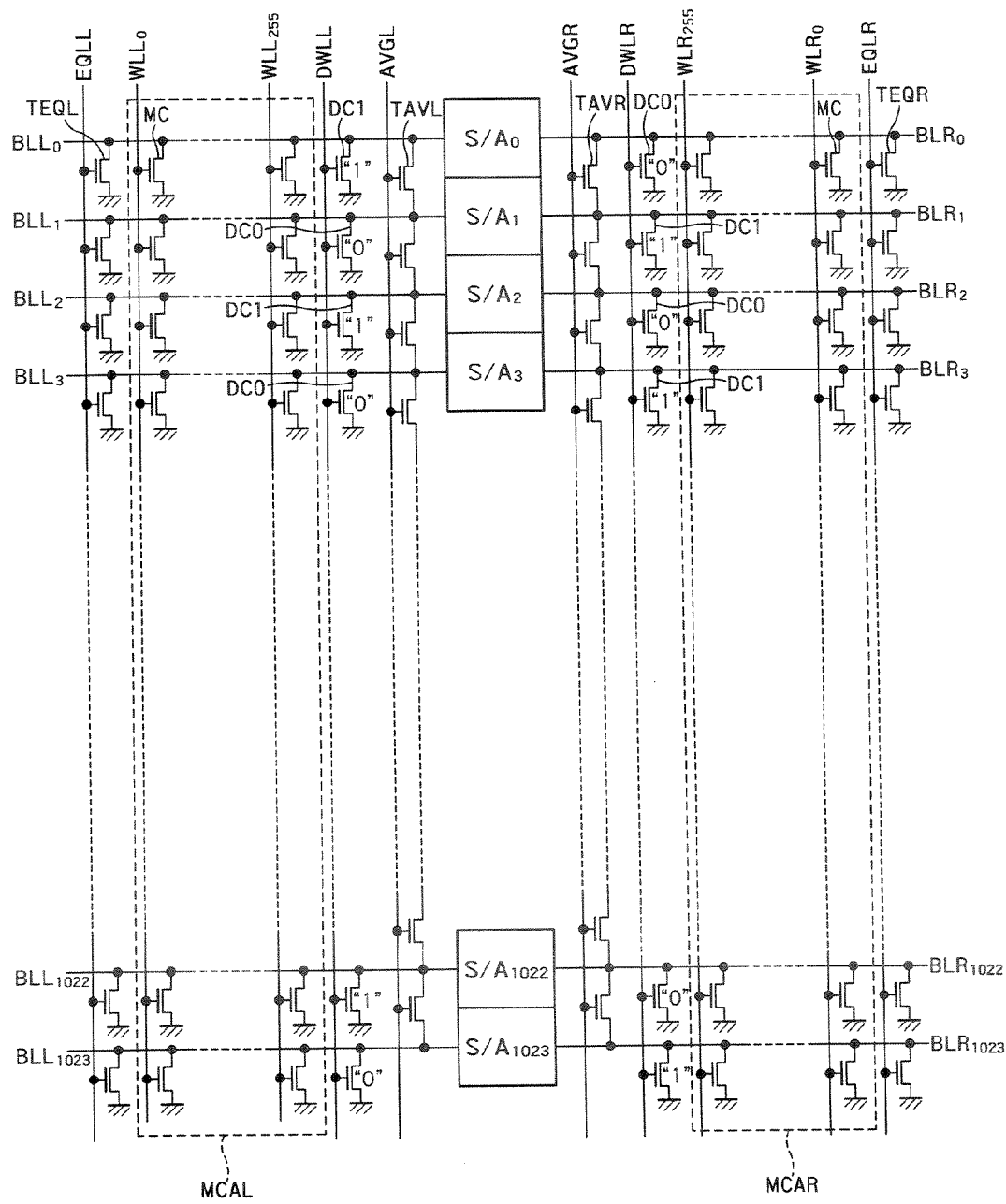
FIG. 1 is a schematic circuit diagram of an FBC memory device 100 according to an embodiment of the present invention.

FIG. 1 is a schematic circuit diagram of an FBC memory device 100 according to an embodiment of the present invention. The FBC memory device 100 includes memory cells MCs, a dummy cell DC0 as a first dummy cell, a dummy cell DC1 as a second dummy cell, word lines WLLi, WLRi (i is an integer) (hereinafter, also "WL"), dummy word lines DWLL, DWLR (hereinafter, also "DWL"), bit lines BLL1, BLRi (hereinafter, also "BL"), sense amplifiers S/Ai (hereinafter, also "S/A"), equalizing lines EQLL, EQLR (hereinafter, also as "EQL") equalizing transistors TEQL, TEQR (hereinafter, also as "TEQ"), averaging lines AVGL, AVGR (hereinafter, also as "AVG"), and averaging transistors TAVL, TAVR (hereinafter, also as "TAV").

The memory cells MCs are arranged in matrix, and constitute memory cell arrays MCAL, MCAR (hereinafter, also "MCA"). The word line WL is extended in a row direction, and is connected to a gate of the memory cell MC. The word lines WLs are provided by 256 lines at each of the left and right sides of the sense amplifier S/A, respectively, and are shown as WLL0 to WLL255 and WLR0 to WLR255 in FIG. 1. The bit lines BLs are extended in a column direction, and are connected to a source or a drain of the memory cell MCs, respectively. The bit line BLs are provided by 1024 lines at each of the left and right sides of the sense amplifier S/A, respectively, and are shown as BLL0 to BLL1023 and BLR0 to BLR1023 in FIG. 1. The word lines WLs and the bit lines BLs cross each other, and a memory cell MC is provided at each intersection. This is called a cross-point cell. The row direction and the column direction can be replaced with each other.

Prior to the data reading/writing operation, the dummy cells DC0 and DC1 store data "0" and data "1" having mutually opposite polarities, respectively. The data is written into the dummy cells DC0 and DC1 usually immediately after the power supply is turned on. The polarity means a data logical value "0" or "1". The dummy cells DC0 and DC1 are used to generate a reference current Iref at the time of detecting data of the memory cell MC. The reference current Iref is a current substantially in the middle of a detected current of data "0" and a detected current of data "1". The reference current Iref flows from a current mirror to the memory cell MC. Data of the memory cell MC is transmitted to a sense node within the sense amplifier S/A. The sense amplifier S/A discriminates between a logical value "0" and a logical value "1" of data, based on whether a current flowing the memory cell MC is higher or lower than the reference current Iref.

The dummy cells DC0 and DC1 are alternately laid out toward a direction (a column direction) in which the word lines WLs are extended. In other words, the opposite data is written into the dummy cells DCs at every one bit line BL along the dummy word line DWL. Further, dummy cells DC0 and DC1 of mutually opposite polarities are provided at the left and right sides of a certain sense amplifier S/A, respectively. The dummy cells DC0s and the dummy cells DC1s are provided by the same number.

The dummy word line DWL is extended in a row direction, and is connected to a gate of the dummy cell DC. The dummy word line DWL is provided by one at each of the left and right sides of the sense amplifier S/A, respectively, and these dummy word lines are shown as DWLL and DWLR in FIG. 1.

The equalizing line EQL is connected to a gate of an equalizing transistor TEQ. The equalizing transistor TEQ is connected to between the bit line BL and the ground. The equalizing transistor TEQ equalizes the potential of each bit line BL with the ground potential by connecting the bit line BL to the ground.

The averaging line AVG is connected to a gate of the averaging transistor TAV. The averaging transistor TAV is connected to between adjacent two bit lines BLs. The averaging transistor TAV averages currents flowing through the dummy cells DC0 and DC1, by short-circuiting the dummy cells DC0 and DC1 at the time of reading data, thereby generating the reference current Iref.

Figure 2:
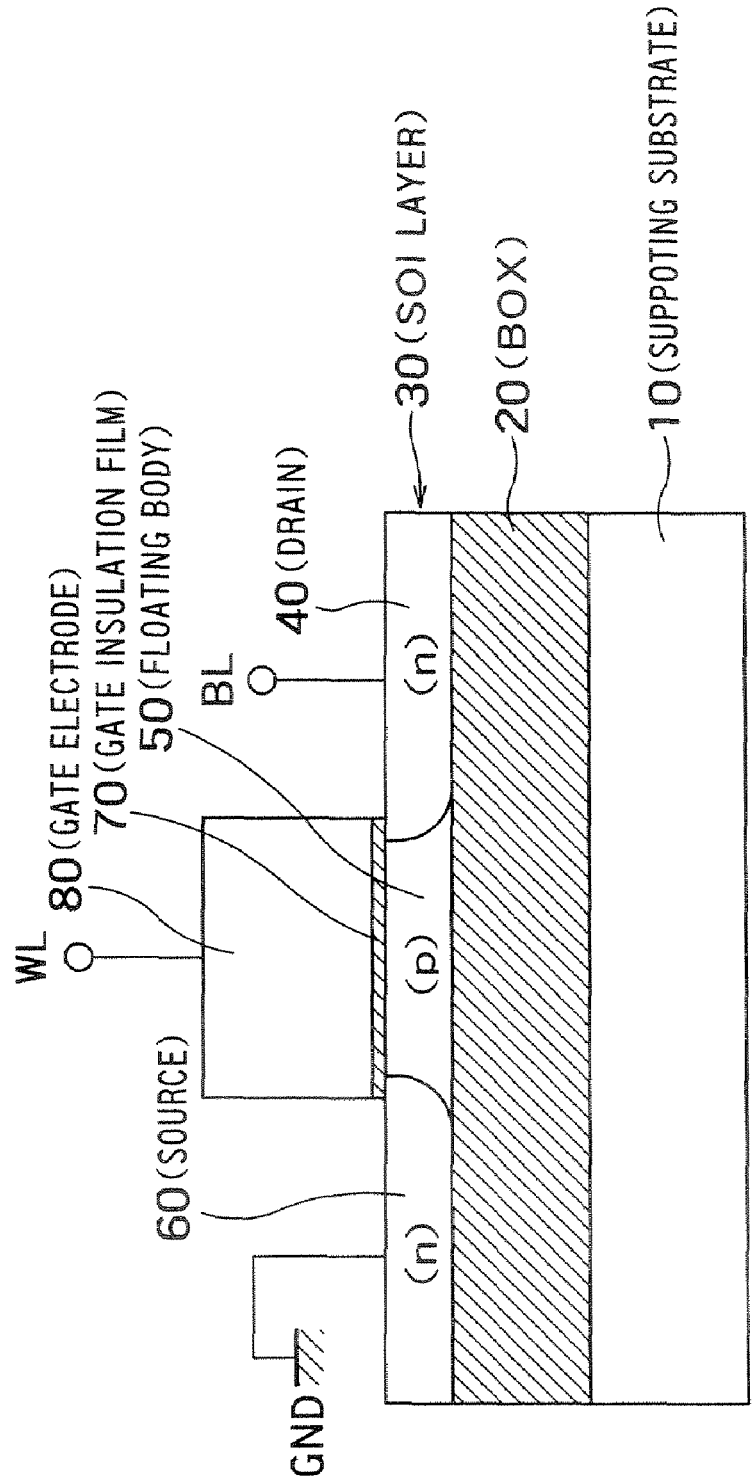
FIG. 2 is a cross-sectional view showing a configuration of one memory cell MC.

FIG. 2 is a cross-sectional view showing a configuration of one memory cell MC. The memory cell MC is provided on an SOI substrate including a supporting substrate 10, a BOX layer 20, and an SOI layer 30. A source 60 and a drain 40 are provided within the SOI layer 30. A floating body 50 is formed on the SOI layer 30 between the source 60 and the drain 40. The floating body 50 has a conductivity type opposite to a conductivity type of the source 60 and the drain 40. The floating body 50 is in an electrically floating state by being encircled by the source 60, the drain 40, the BOX layer 20, a gate insulation film 70, and an STI (not shown). The FBC memory can store data depending on the number of majority carriers within the floating body 50.

For example, assume that the memory cell MC is an N-type MISFET. A state that there are many holes accumulated in the body 50 is defined as data "1", and a state that there are few holes is defined as data "0".

In order to write data "1" into the memory cell MC, the memory cell MC is operated in a saturated state. For example, the word line WL is biased to 1.5V, and the bit line BL is biased to 1.5V. The source is the ground GND (0V). With this arrangement, impact ionization occurs near the drain, and many electron-hole pairs occur. Electron generated by the impact ionization flows to the drain, and the holes are accumulated in the body having a low potential. A body voltage reaches an equilibrium state, when the current flowing at the time of generation of holes by impact ionization is balanced with the forward current at the pn junction between the body and the source. The body voltage is approximately 0.7V.

The bit line BL is lowered to a negative voltage at the time of writing data "0". For example, the bit line BL is lowered to −1.5V. Based on this operation, the pn junction between the body 50 and the drain 40 is biased large to the forward direction. As a result, the holes accumulated in the body 50 are discharged to the drain 40, and data "0" is stored in the memory cell MC.

In the data reading operation, the word line WL is activated in a similar manner to that of writing data. However, the bit line BL is set lower than that of writing data "1". For example, the word line WL is set to 1.5V, and the bit line BL is set to 0.2V. The memory cell MC is operated in a linear region. A memory cell MC storing data "0" and a memory cell MC storing data "1" are different in a threshold voltage of the memory cell MC, based on a difference of the number of holes accumulated in the body 50. Data "1" and data "0" are identified by detecting a current difference based on a difference between the threshold values. A reason for setting the bit line BL to a low voltage at the reading time is that, when a voltage of the bit line BL is set high to bias the memory cell MC in a saturation state, data "0" is changed to data "1" by impact ionization at the time of reading data "0".

Figure 3:
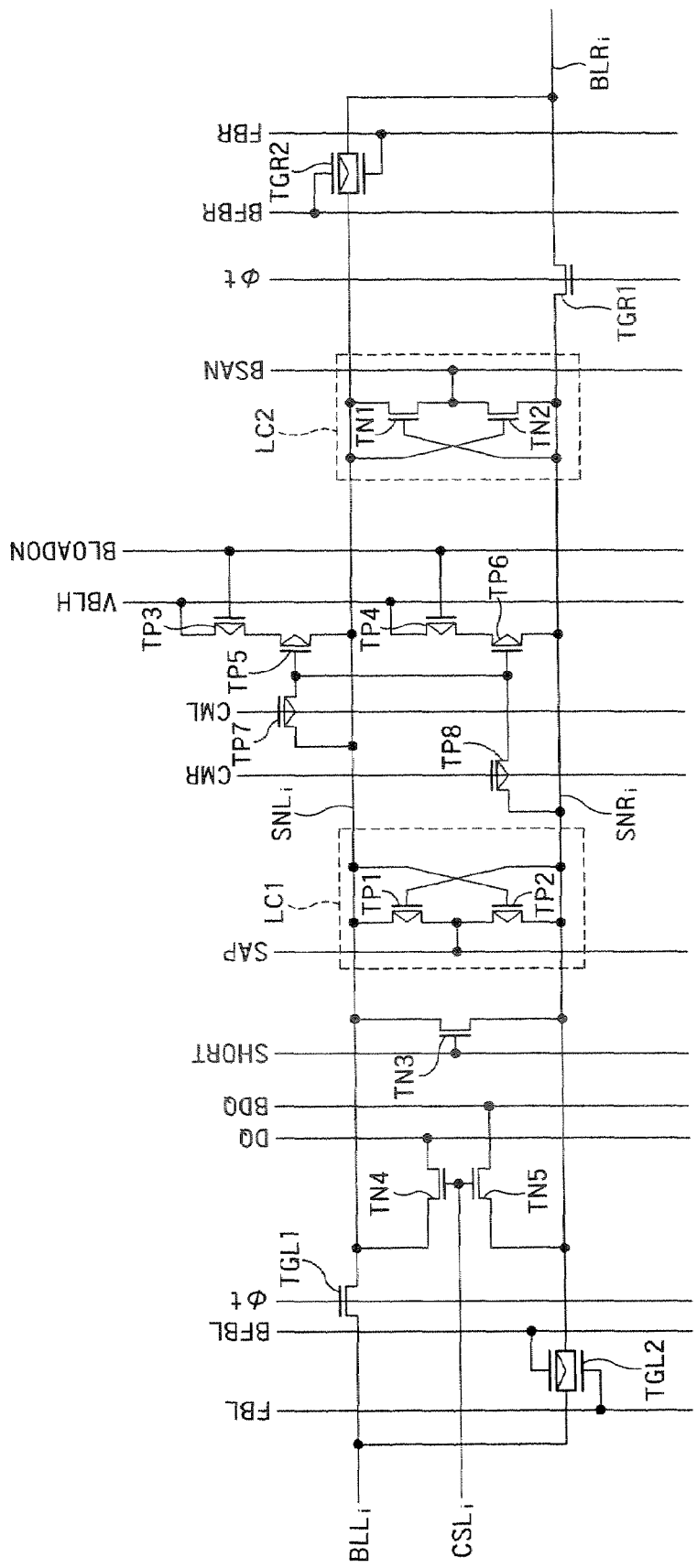
FIG. 3 is a circuit diagram showing a configuration of the sense amplifier S/Ai.

FIG. 3 is a circuit diagram showing a configuration of the sense amplifier S/Ai. The sense amplifier S/A is connected to one bit line BLLi and one bit line BLRi provided at each of the left and right sides, respectively, and is provided corresponding to each of the pair of bit lines BLLi and BLRi. As explained above, in the present embodiment, an open bit line configuration is employed. Therefore, during a data reading time, one of the pair of bit lines BLLi and BLRi transmits data, and the other bit line transmits a reference data. The reference data becomes a data detection reference at the time of detecting the data of the memory cell.

The sense amplifier S/A includes a pair of sense nodes SNLi (hereinafter, also "SNL") and SNRi (hereinafter, also "SNR"). The sense node SNL is connected to the bit line BLL via a transfer gate TGL1, and is connected to the bit line BLR via a transfer gate TGR2. The sense node SNR is connected to the bit line BLL via the transfer gate TGL2, and is connected to the bit line BLR via a transfer gate TGR1.

The transfer gates TGL1 and TGR1 are on-off controlled by a signal ΦDt. The transfer gate TGL2 is on/off controlled by signals FBL and BFBL. The transfer gate TGR2 is on/off controlled by signals FBR and BFBR.

For example, when data "1" on the bit line BLL is detected, a threshold voltage of the N-type memory cell MC becomes relatively low. Therefore, a potential of the sense node SNL becomes lower than a potential of the sense node SNR. On the other hand, in the refresh operation, a high potential needs to be given to the bit line BLL to write back data "1" to the memory cell MC. By turning on the transfer gate TGL2, the high-potential sense node SNR is connected to the bit line BLL. In the refresh operation, data stored in memory cells or dummy cells are read to sense amplifiers, then the data are written back (rewritten or restored) to the same memory cells or the same dummy cells.

The sense amplifier S/A includes cross-coupled dynamic latch circuits (hereinafter, a "latch circuit") LC1 and LC2. The latch circuit LC1 includes two p-type transistors TP1 and TP2 connected in series between sense nodes SNL and SNR. A gate of the transistor TP1 is connected to the sense node SNR, and a gate of the transistor TP2 is connected to the sense node SNL. In other words, the gates of the transistors TP1 and TP2 are cross-coupled to the sense nodes SNL and SNR. The latch circuit LC2 includes two n-type transistors TN1 and TN2 connected in series between the sense nodes SNL and SNR. A gate of the transistor TN1 is connected to the sense node SNR, and a gate of the transistor TN2 is connected to the sense node SNL. In other words, the gates of the transistors TN1 and TN2 are cross-coupled to the sense nodes SNL and SNR. The latch circuits LC1 and LC2 are driven by the activation of signals SAP and BSAN.

The sense amplifier S/A further includes p-type transistors TP3 to TP8 between the latch circuits LC1 and LC2. The transistors TP3 to TP8 constitute a current-mirror-type current load circuit, and are configured to pass equal currents to the sense nodes SNL and SNR. The transistors TP3 and TP4 are controlled by a signal BLOADON, and function as a switching element that switches between a power supply VBLH and the above current mirror. The power supply VBLH shows a high potential to be given to the bit line when data "1" is written into the memory cell MC. The transistors TP7 and TP8 are controlled by the signals CML and CMR, respectively, and connect the gates of the transistors TP5 and TP6 to the sense nodes SNL and SNR, respectively As a result, the transistors TP5 and TP6 can equally pass the reference current, to the sense nodes SNL and SNR.

An n-type transistor TN3 is connected to between the sense nodes SNL and SNR, and is controlled by a signal SHORT. The transistor TN3 short-circuits sense nodes SN and bSN before the reading/writing operation, thereby equalizing the sense nodes SNL and SNR.

An n-type transistor TN4 is connected to between a DQ line and the sense node SNL, and an n-type transistor TN5 is connected to between a BDQ line and the sense node SNR. Gates of the transistors TN4 and TN5 are connected to a column selection line CSLi (hereinafter, also "CSL"). The DQ line and the BDQ line are connected to a DQ buffer (not shown). The DQ buffer is connected to an I/O pad. At the time of reading data, the DQ buffer temporarily stores data to output the data from the memory cell MC to the outside. At the time of writing data, the DQ buffer temporarily stores data to transmit the data from the outside to the sense amplifier S/A. Therefore, the column selection line CSL is activated at the time of reading data to the outside or at the time of writing data from the outside, and enables a connection of the sense nodes SNL and SNR to the DQ buffer. During a refreshing, the column selection line CSL maintains an inactive state.

Figure 4:
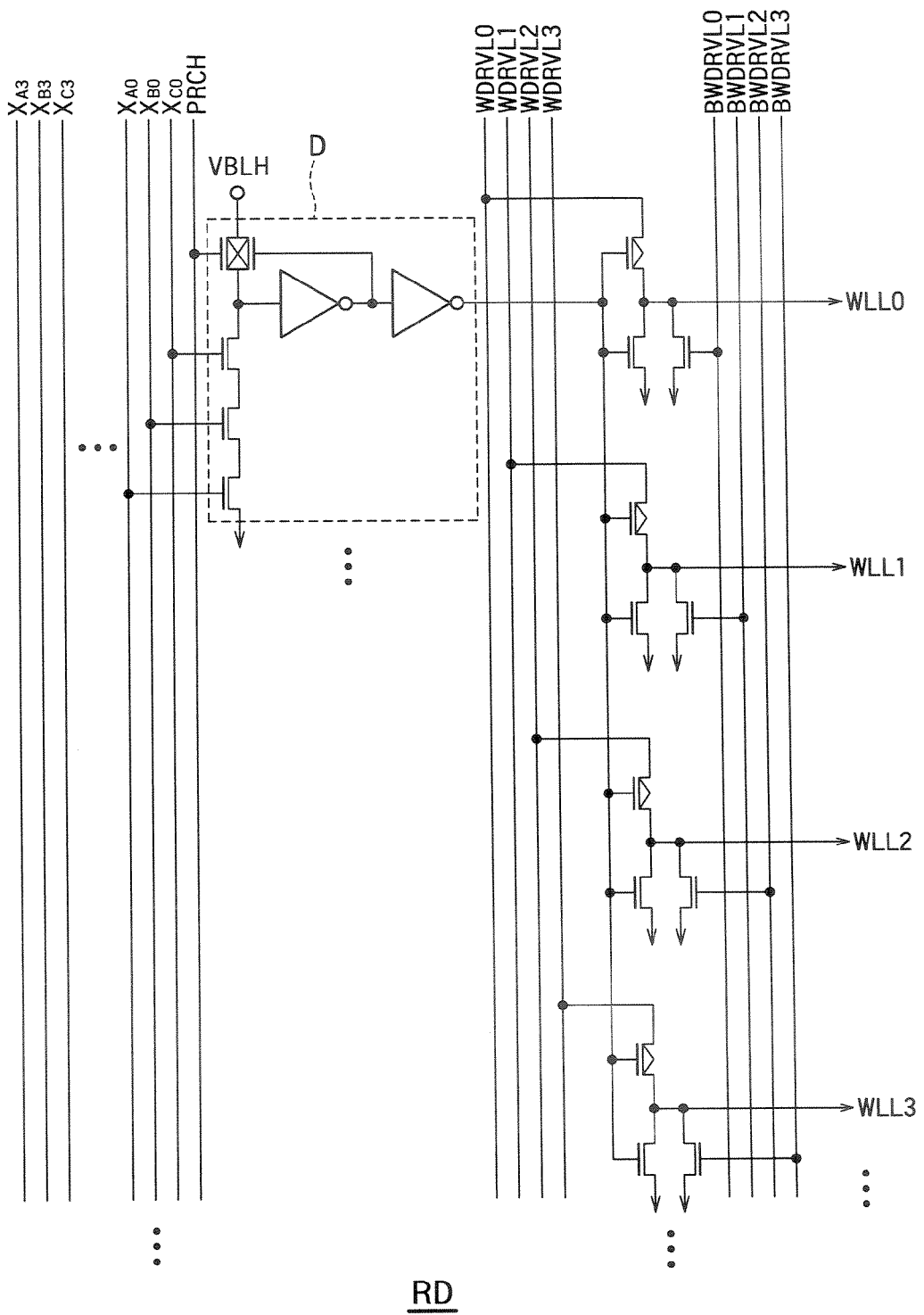
FIG. 4 is a circuit diagram showing a configuration of a row decoder RD that activates any one of the word lines WLs.

FIG. 4 is a circuit diagram showing a configuration of a row decoder RD that activates any one of the word lines WLs. This row decoder RD is connected to the word line WLLi provided at the left side of the sense amplifier S/A. Although a row decode RD is also provided in the word line WLRi, this explanation will be omitted because this row decoder also has a configuration similar to that of the row decoder RD shown in FIG. 4. However, a reference symbol of a word drive line becomes WDRVRi.

The row decoder RD selectively activates any one of the word lines WLL1 to WLL255. In this case, 64 decoders Ds are laid out, and one decoder D is provided corresponding to four word lines WLs. With this arrangement, 256 word lines WLs are driven. Word drive lines WDRVL0 to WDRVL3 are provided corresponding to four word lines WL connected to one decoder D. Word drive lines BWDRVL0 to BWDRVL3 are inversion signals of the word drive lines WDRVL0 to WDRVL3, respectively.

XA0 to XA3, XB0 to XB3, and XC0 to XC3 are 12 signal lines that are predecoded row addresses, and have 4×4×4 ways (64 ways) of selection capacity. Any three signal lines are output to the 64 decoders D, out of the signal lines XA0 to XA3, XB0 to XB3, and XC0 to XC3. There are no plural decoders Ds to which the same three signal lines are input, and at least one signal line is different among plural decoders Ds. The decoder signal lines XA0 to XA3, XB0 to XB3, and XC0 to XC3 are used to select one decoder D out of the 64 decoders Ds. The selected decoder D outputs a ground potential (LOW).

When the selected decoder D outputs LOW, word lines WLs corresponding to the selected decoder D are disconnected from the ground, and are connected to the word drive lines WDRVL0 to WDRVL3. When one of the word drive lines WDRVL0 to WDRVL3 is activated (HIGH (high level)), one word line WL is selected from four word lines WLs corresponding to the selected decoder D. In this case, three non-selected word lines WDs among the four word line WLs corresponding to the selected decoder D are connected to the ground by the word drive line BWDRVLi.

A signal PRCH is a precharge signal of the row decoder RD, and is at a LOW (low level) at a precharge time. At the precharge time, the precharge signal, and the signals XA0 to XA3, XB0 to XB3, and XC0 to XC3 are all at the LOW level. Therefore, the decoder D outputs a HIGH signal. When the FBC memory device shifts from a precharge state to data read/write and refresh states, the signal PRCH first becomes a HIGH level, and the power supply VBLH at a HIGH level is disconnected from the decoder D. Thereafter, a row address is made firm, and a desired word line rises.

Figure 5A:
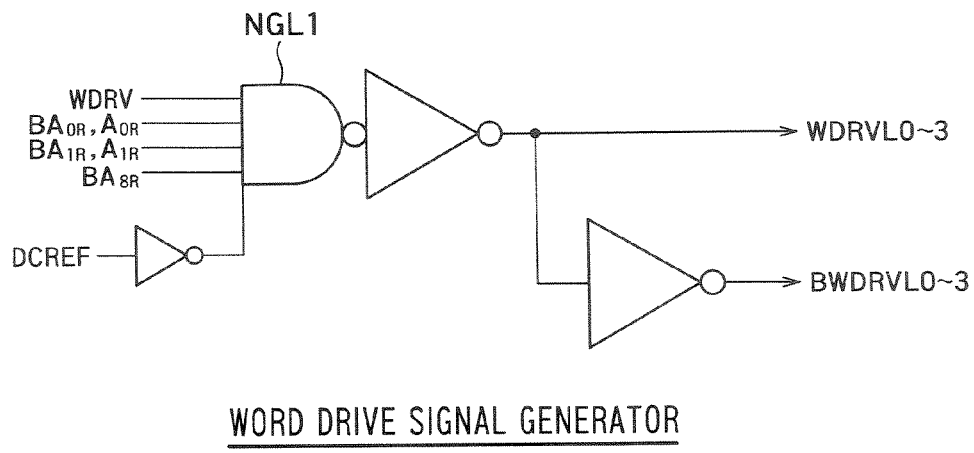
FIGS. 5A and 5B are circuit diagrams showing generators of the word drive signals.
Figure 5B:
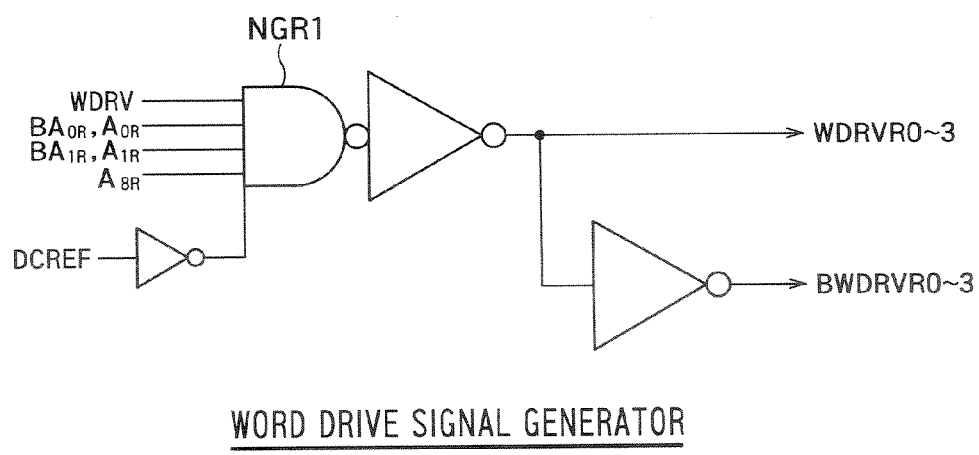

FIG. 5A is a circuit diagram showing a generator of the word drive signals WDRVL0 to WDRVL3. The word drive signal generator shown in FIG. 5A includes a NAND gate NGL1 that performs a NAND operation of a signal WDRV, row address signals A0R, A1R, BA0R, BA1R, BA8R, and a signal DCREF. FIG. 5B is a circuit diagram showing a generator of the word drive lines WDRVR0 to WDRVR3. The word drive signal generator shown in FIG. 5B includes a NAND gate NGR1 that performs a NAND operation of a signal WDRV, row address signals A0R, A1R, BA0R, BA1R, BA8R, and a signal DCREF.

The signal WDRV determines a timing of starting the signals of the word drive lines WDRVL0 to WDRVL3 and WDRVR0 to WDRVR3. The signal DCREF is a dummy cell refresh signal that is activated by HIGH at the time of executing a dummy-cell DC refresh operation. When the signal DCREF becomes active (HIGH) in the dummy-cell DC refresh operation, all signals of the word drive signals WDRVL0 to WDRVL3 become in the inactive state, regardless of the signals A0R, A1R, A8R, BA0R, BA1R, BA8R.

The signals A0R, A1R, A8R are row address signals. The signals BA0R, BA1R, BA8R are inversion signals of A0R, A1R, A8R, respectively. The signals BA8R and A8R are selection signals of memory cell arrays MCL and MCR positioned at the left and right sides of the sense amplifier S/A, respectively. When the signal A8R becomes HIGH, for example, the memory cell MCR is selected. When the signal BA8R becomes HIGH, the memory cell MCL is selected.

During data reading, data writing, and a memory-cell MC refresh operation, the signal DCREF is inactive (LOW). In this case, the word drive signal generator shown in FIG. 5A outputs a result of executing NAND of the signals A0R, A1R, and A8R as the signals WDRVL0 to WDRVL3 and BWDRVL0 toe BWDRVL3 at the timing when the signal WDRV is activated to HIGH. The word drive signal generator shown in FIG. 5B outputs a result of executing NAND of the signals BA0R, BA1R, and BA8R as the signals WDRVR0 to WDRVR3 and BWDRVR0 to BWDRVR3.

The signals A0R and A1R are selection signals of the four word drive lines WDRVL0 to WDRVL3. For example, the signals BA0R and BA1R are input to the word drive signal generator that generates the word drive signal WDRVL0, the signals A0R and BA1R are input to the word drive signal generator that generates the word drive signal WDRVL1, the signals BA0R and A1R are input to the word drive signal generator that generates the word drive signal WDRVL2, and the signals A0R and A1R are input to the word drive signal generator that generates the word drive signal WDRVL3. As a result, one of the word drive signals WDRVL0 to WDRVL3 becomes HIGH for the four combinations of the signals A0R to A1R.

Figure 6A:
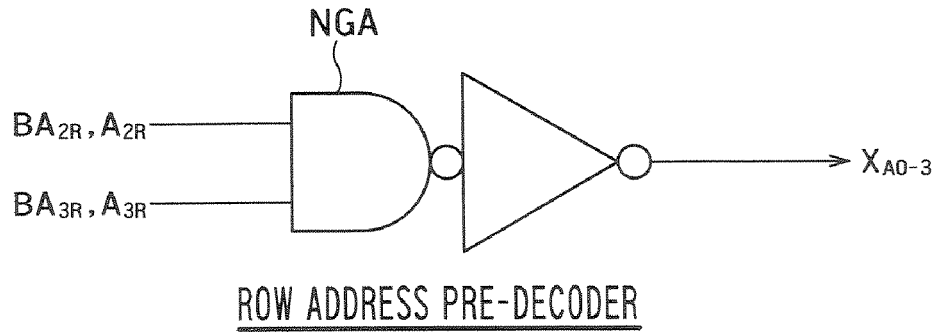
FIG. 6A to FIG. 6C are circuit diagrams showing configurations of row address pre-decoders.
Figure 6B:
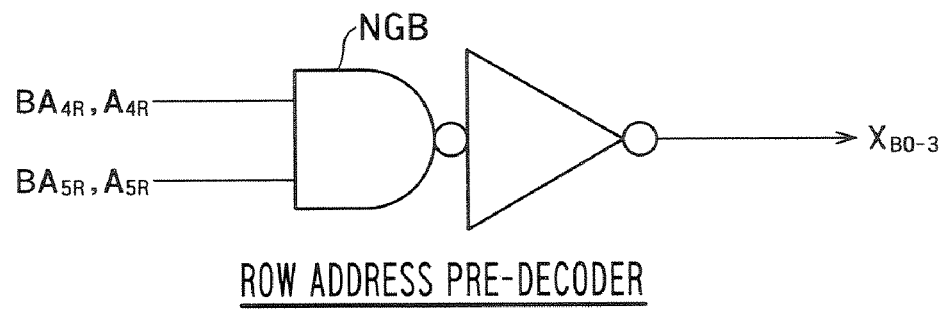
Figure 6C:
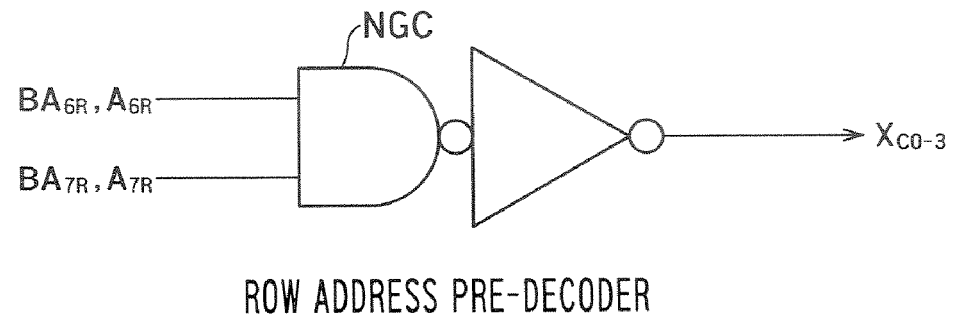

FIG. 6A to FIG. 6C are circuit diagrams showing configurations of row address pre-decoders. The row address pre-decoder shown in FIG. 6A includes a NAND gate NGA that performs a NAND operation of row addresses A2R, A3R, BA2R, BA3R. The row address pre-decoder shown in FIG. 6B includes a NAND gate NGB that performs a NAND operation of row addresses A4R, A5R, BA4R, BA5R. The row address pre-decoder shown in FIG. 6C includes a NAND gate NGC that performs a NAND operation of row addresses A6R, A7R, BA6R, BA7R. The row address pre-decoders input the row addresses A2R to A7R, and generate the decoder signals XA0 to XA3, XB0 to XB3, and XC0 to XC3 shown in FIG. 4.

Figure 7A:
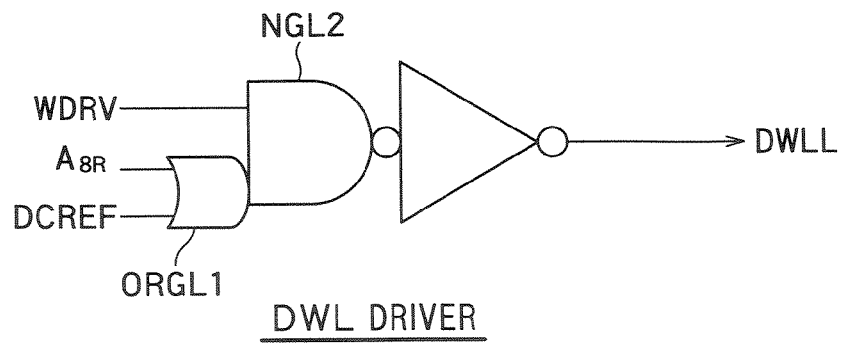
FIG. 7A and FIG. 7B are circuit diagrams showing configurations of dummy word-line driver.
Figure 7B:
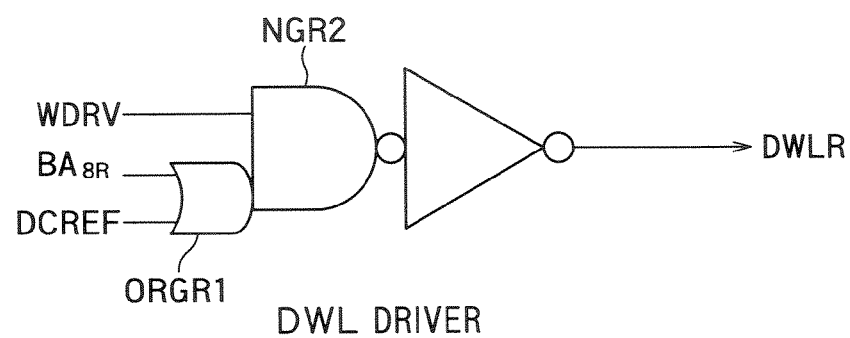

FIG. 7A and FIG. 7B are circuit diagrams showing configurations of dummy word-line driver. The dummy word-line driver shown in FIG. 7A includes an OR gate ORGL1 that performs an OR operation of a row address signal A8R and a dummy cell refresh signal DCREF, and a NAND gate NGL2 that performs a NAND operation of an output of the OR gate ORGL1 and a signal WDRV. The dummy word-line driver shown in FIG. 7B includes an OR gate ORGR1 that performs an OR operation of a row address signal BA8R and a dummy cell refresh signal DCREF, and a NAND gate NGR2 that performs a NAND operation of an output of the OR gate ORGR1 and a signal WDRV.

The signal WDRV determines a timing of rising the dummy word lines DWLL and DWLR. When the signal DCREF becomes active (HIGH) in the dummy-cell DC refresh operation, the dummy word lines DWLL and DWLR are all simultaneously activated (HIGH) regardless of the row address signals A8R, BA8R. In this case, the timing when the dummy word lines DWLL and DWLR are activated is controlled by activating the signal WDRV.

During data reading, data writing, and a memory-cell MC refresh operation, the signal DCREF is inactive (LOW). Therefore, this dummy word-line driver activates the dummy word line DWLL or DWLR shown in FIG. 1, based on the signals A8R and BA8R. When the signal A8R is active (HIGH), for example, the dummy word line activating circuit activates (HIGH) the dummy word line DWLL provided at the left side of the sense amplifier S/A. When the dummy word line DWLL is active, the sense amplifier S/A receives data from a memory cell MC within a memory cell array MCAR, and receives a reference current from a dummy cell DC within a memory cell array MCAL. With this arrangement, the sense amplifier S/A detects data of the memory cell MC within the memory cell array MCAR. On the other hand, when the signal BA8R is active (HIGH), the dummy word-line driver activates (HIGH) the dummy word line DWLR provided at the right side of the sense amplifier S/A. When the dummy word line DWLL is active, the sense amplifier S/A detects data of the memory cell MC within the memory cell array MCAL.

Figure 8A:
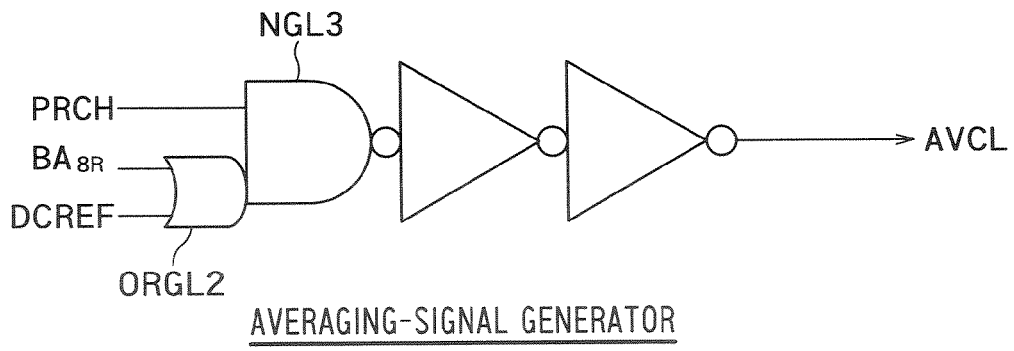
FIG. 8A and FIG. 8B are averaging-signal generators.
Figure 8B:
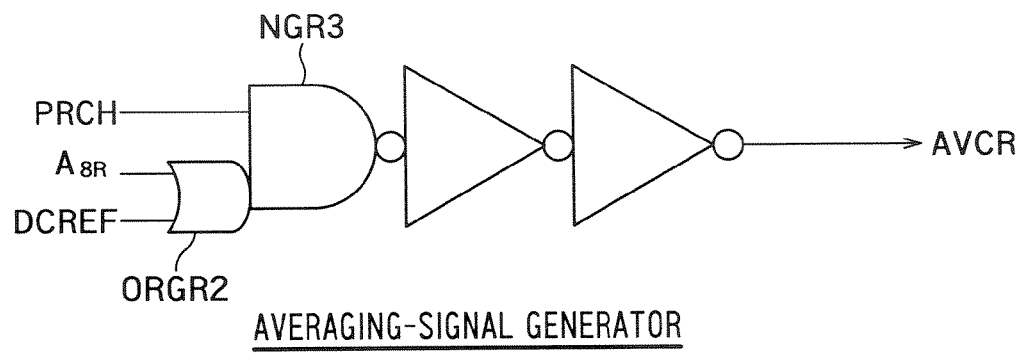

FIG. 8A and FIG. 8B are averaging-signal generators. The averaging-signal generator shown in FIG. 8A includes an OR gate ORGL2 that performs an OR operation of the row address signal BA8R and the dummy cell refresh signal DCREF, and a NAND gate NGL3 that performs a NAND operation of an output of the OR gate ORGL2 and the precharge signal PRCH. The averaging-signal generator shown in FIG. 8B includes an OR gate ORGR2 that performs an OR operation of the row address signal A8R and the dummy cell refresh signal DCREF, and a NAND gate NGR3 that performs a NAND operation of an output of the OR gate ORGR2 and the precharge signal PRCH.

The signal PRCH controls a timing of rising the signals of the dummy word lines DWLL and DWLR. In other words, the averaging-signal generator activates the signal of the dummy word line DWLL or DWLR, when the FBC memory device shifts from a precharge state to a data reading state.

When the signal DCREF becomes active (HIGH) in the dummy-cell DC refresh operation, the averaging signal lines AVGL and AVGR are all inactivated (LOW) regardless of the signal levels of the row address signals A8R, BA8R. The averaging signal lines AVGL and AVGR are inactivated at the timing when the signal PRCH becomes HIGH. When the averaging signal lines AVGL and AVGR are inactivated, all bit lines BLLi and BLRi within the memory cell arrays MCAL and MCAR are mutually separated. As a result, the sense amplifier S/A can refresh individual dummy cells DCs.

During data reading, data writing, and a memory-cell MC refresh operation, the signal DCREF is inactive (LOW). Therefore, the averaging-signal generator inactivates (LOW) the averaging signal line AVGL or AVGR shown in FIG. 1, based on the signals A8R and BA8R. During the precharging, both the averaging signal lines AVGL and AVGR are in the active state (HIGH).

When the signal A8R is active (HIGH), for example, the averaging-signal generator inactivates (LOW) the averaging signal line AVGR provided at the right side of the sense amplifier S/A. As a result, the averaging transistor TAVR becomes in the off state, and the bit lines BLRi are mutually separated. On the other hand, the averaging transistor TAVL maintains the on state, and the bit lines BLLi are short-circuited by the averaging transistor TAVL. In this state, the sense amplifier S/A flows a current based on data in a memory cell MC within the memory cell array MCAR to the memory cell MC, and also flows the reference current to a dummy cell DC within the memory cell array MCAL. Accordingly, the sense amplifier S/A detects data of the memory cell MC within the memory cell array MCAR.

On the contrary, when the signal BA8R is active (HIGH), the averaging-signal generator inactivates (LOW) the averaging signal line AVGL provided at the left side of the sense amplifier S/A. As a result, the averaging transistor TAVR becomes in the off state, and the bit lines BLLi are mutually separated. On the other hand, the averaging transistor TAVR maintains the on state, and the bit lines BLRi are short-circuited by the averaging transistor TAVR. In this state, the sense amplifier S/A flows a current based on data from a memory cell MC within the memory cell array MCAL to the memory cell MC, and also flows a reference current to a dummy cell DC within the memory cell array MCAR. Accordingly, the sense amplifier S/A detects data of the memory cell MC within the memory cell array MCAL.

FIG. 9A and FIG. 9B show circuits that generate signals CML and CMR for controlling the current mirror shown in FIG. 3. The CML/CMR generator shown in FIG. 9A includes an OR gate ORGL3 that performs an OR operation of a row address signal BA8R and a dummy cell refresh signal DCREF, and a NAND gate NGL4 that performs a NAND operation of an output of an OR gate ORGL3 and a precharge signal PRCH The CML/CMR generator shown in FIG. 9B includes a NAND gate NGR4 that performs a NAND operation of a row address signal A8R, and inversion signal of a dummy cell refresh signal DCREF, and a precharge signal PRCH.

In data reading, data writing, and a memory-cell MC refresh operation, the signal PRCH controls a timing when the signals MCL and MCR become inactive (HIGH). The signals MCL and MCR are active (LOW) during a precharging.

When the signal DCREF is inactive (LOW), the CML/CMR generator inactivates (HIGH) the signal CML or CMR based on the signals A8R and BA8R, to disconnect between a sense node of transmitting data and a gate of the current mirror (TP5 or TP6).

When the signal A8R is HIGH, for example, the CML/CMR generator inactivates (HIGH) a signal CMR provided at the right side of the sense amplifier S/A. As a result, the transistor TP8 shown in FIG. 3 becomes in the off state, and the sense node SNRi is disconnected from the gate of the transistor TP6. On the other hand, because the signal BA8R is active (LOW), the signal CML is active (LOW). As a result, the sense node SNLi is connected to the gate of the transistor TP5. In this case, the reference current flows from the sense node SNLi to the bit line BLLi. The current based on data in the memory cell MC within the memory cell array MCAR flows from the sense node SNRi to the bit line BLRi. The sense amplifier S/A detects data from the bit line BLRi based on the reference current flowing the bit line BLLi.

On the contrary, when the signal BA8R becomes HIGH, the signal CML becomes inactive (HIGH). As a result, the sense node SNLi is disconnected from the gate of the transistor TP5. On the other hand, because the signal A8R is LOW, the signal CMR is active (LOW). As a result, the sense node SNRI is connected to the gate of the transistor TP6. In this case, the reference current flows from the sense node SNRi to the bit line BLRI, and a current based on data in a memory cell of the memory cell array MCAL flows from the sense node SNLi to the bit line BLLi. As a result, the sense amplifier S/A detects data from the bit line BLLi based on the reference current flowing the bit line BLRi.

When the signal DCREF becomes active (HIGH) in the dummy-cell DC refresh operation, the signal CML becomes inactive (HIGH) and the signal MCR becomes active (LOW), regardless of the row address signals A8R, BA8R. The signal CML becomes HIGH at the timing when the signal PRCH becomes HIGH. The signal MCR maintains LOW at the timing when the signal DCREF is input, regardless of the signal PRCH. In the dummy-cell DC refresh operation, the bit line BLL and the bit line BLR are connected to the corresponding dummy cell DC. In this case, because the signal MCR is LOW, the potential of the sense node SNRi becomes a reference potential.

It should be noted that the dummy cell DC0 and the dummy cell DC1 of mutually opposite polarities are provided at the left and right sides of a certain sense amplifier S/A, respectively. Based on this, one of the currents flowing the sense amplifiers SNR and SNL can be detected as a reference current, and the other current can be detected as data.

When one of the currents flowing the sense amplifiers SNR and SNL is a reference current, this is sufficient. Therefore, the circuits shown in FIG. 9A and FIG. 9B may be exchanged. In this case, the output of the circuit shown in FIG. 9A can be CMR, and the output of the circuit shown in FIG. 9B can be CML. In other words, in the dummy-cell DC refresh operation, the sense amplifier S/A can detect a current based on data from the dummy cell DC within the memory cell array MCAL as a reference current, or can detect a current based on data from the dummy cell DC within the memory cell array MCAR as a reference current. This is because the dummy cell DC0 and the dummy cell DC1 of mutually opposite polarities are provided at the left and right sides of a certain sense amplifier S/A, respectively.

As explained above, in the present embodiment, in the dummy-cell DC refresh operation, the sense amplifier S/A reads data of mutually opposite polarities from the dummy cell DC0 and the dummy cell DC1, and detects a current based on one of the data as a reference current, and detects the other data as data.

Figure 10:
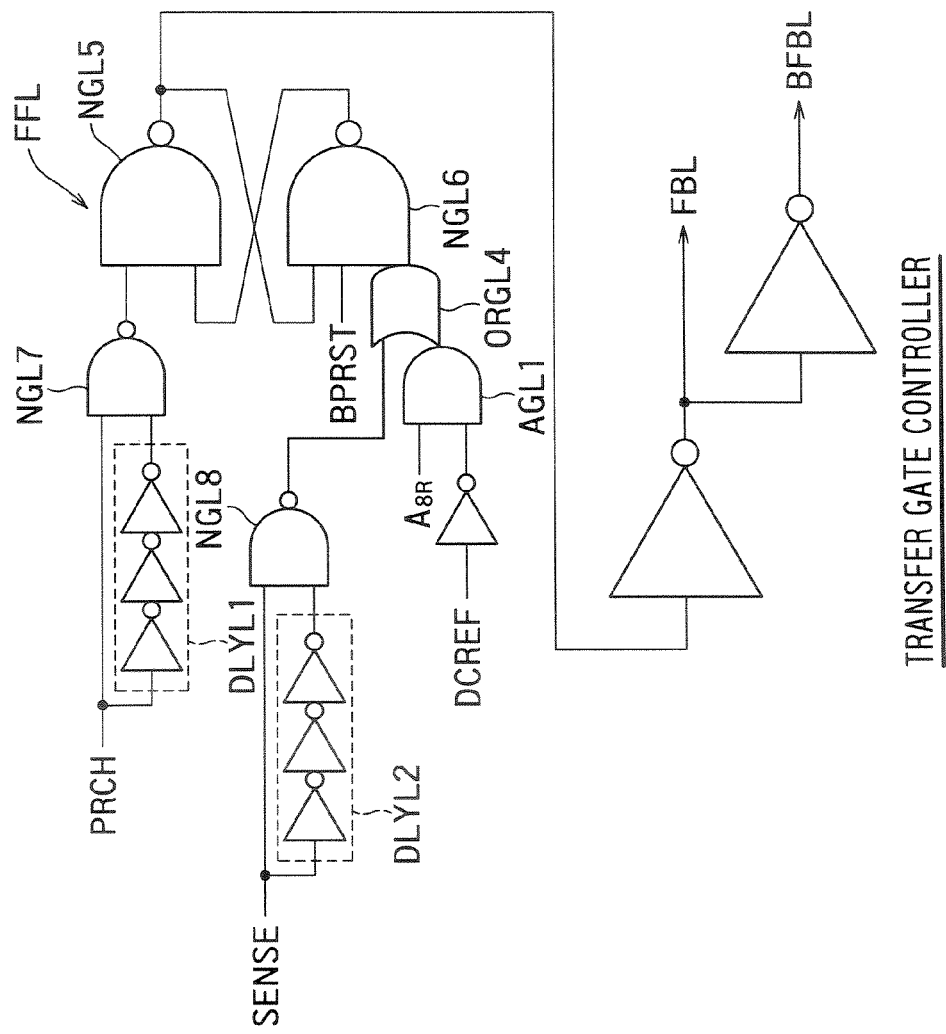
FIG. 10 and FIG. 11 are circuit diagrams of a transfer gate controller.
Figure 11:
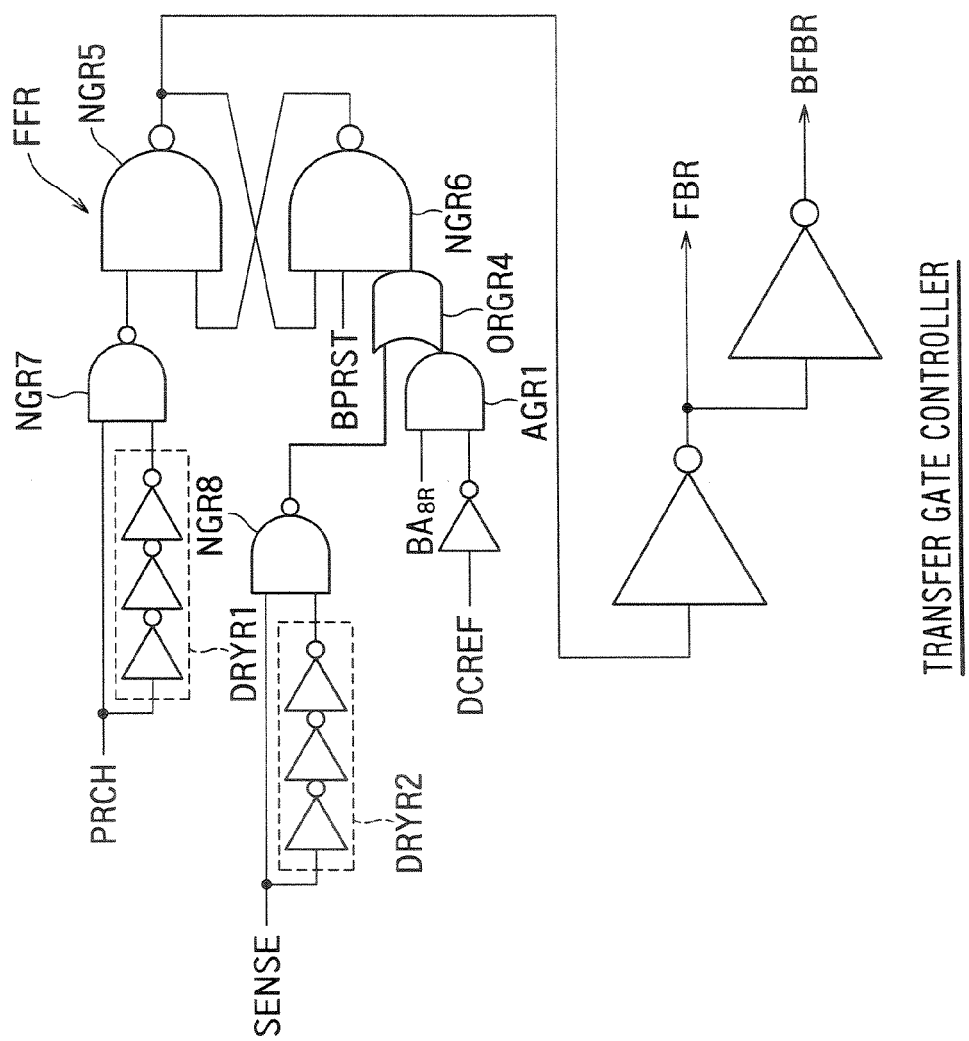

FIG. 10 and FIG. 11 are circuit diagrams of a transfer gate controller. This transfer gate controller is the circuit that generates the feed back signals FBL, FBR, BFBL, and BFBR shown in FIG. 3. The transfer gate controller shown in FIG. 10 includes an SR (set/reset) flipflop FFL having two NAND gates NGL5 and NGL6. This transfer gate controller includes: a delay circuit DLYL1 that delays a precharge signal PRCH; a NAND gate NGL7 that receives the signal PRCH and its delay signal, and outputs a result of their NAND operation to the NAND gate NGL5 of the flipflop FFL; a delay circuit DLYL2 that delays a sense signal SENSE; a NAND gate NGL8 that receives the sense signal SENSE and its delay signal, and outputs a result of their NAND operation; an AND gate AGL1 that receives an inversion signal of a dummy cell refresh signal DCREF and a row address signal A8R, and outputs a result of their AND operations; and an OR gate ORGL4 that receives each output of the NAND gate NGL8 and the AND gate AGL1, and a result of their OR operations to the NAND gate NGL6 of the flipflop FFL.

The transfer gate circuit shown in FIG. 11 includes an SR flipflop FFR having two NAND gates NGR5 and NGR6. This transfer gate controller includes: a delay circuit DLYR1 that delays a precharge signal PRCH; a NAND gate NGR7 that receives the signal PRCH and a delay signal from the DLYR1, and outputs a result of their NAND operation to the NAND gate NGR5 of the flipflop FFR; a delay circuit DLYR2 that delays a sense signal SENSE; a NAND gate NGR8 that receives the sense signal SENSE and a delay signal from the DLYR2, and outputs a result of their NAND operation; an AND gate AGR1 that receives an inversion signal of a dummy cell refresh signal DCREF and a row address signal BA8R, and outputs a result of their AND operations; and an OR gate ORGR4 that receives each output of the NAND gate NGR8 and the AND gate AGR1, and a result of their OR operations to the NAND gate NGR6 of the flipflop FFR.

The signal BPRST rises from LOW to HIGH after the power supply to the FBC memory device is turned on, and thereafter maintains HIGH. The signal BPRST is used to initialize the flipflop FFL, and guarantees that the flipflop FFL is reset to a desired potential level at the beginning of turning on the power supply. The signal FBL is precharged to HIGH, and the signal BFBL is precharged to LOW by the signal BPRST When the precharge signal PRCH maintains LOW or HIGH, the NAND gate NGL7 outputs HIGH. When the precharge signal PRCH shifts from LOW to HIGH (when activated), a signal of the same level is provisionally input to the NAND gate NGL7 for a while. As a result, the NAND gate NGL7 outputs LOW as a short shot pulse. When the NAND gate NGL7 outputs a shot pulse of LOW, the flipflop FFL latches HIGH. As a result, the signal FBL is inactivated from HIGH to LOW, and the signal BFBL is inactivated from LOW to HIGH. As a result, the transfer gate TGL2 is closed.

The signal SENSE is activated (HIGH) when SAP and BSAN shown in FIG. 3 are activated (when the latch circuits LC1 and LC2 operate). When the signal DCREF becomes active (HIGH) in the dummy-cell DC refresh operation, a reset signal based on the signal SENSE is input to the gate NGL6, regardless of the signal A8R. When the sense signal SENSE shifts from LOW to HIGH, the NAND gate NGL8 outputs LOW as a shot pulse. When the NAND gate NGL8 outputs a shot pulse of LOW, the flipflop FFL latches LOW. Accordingly, the signal FBL is activated to HIGH. As a result, the transfer gate TGL2 becomes "on" regardless of a signal level of the low address signal A8R.

Because the transfer gate controller shown in FIG. 11 operates similarly to the transfer gate controller shown in FIG. 10, detailed explanations of the operation will be omitted. A row address signal BA8R is input to the AND gate AGR1, as shown in FIG. 11. When the signal DCREF is active (HIGH) in the dummy-cell DC refresh operation, the transfer gate TGR2 becomes "on" regardless of a signal level of the row address signal BA8R, like the transfer gate TGL2. As a result, desired data can be simultaneously written back into both dummy cells DCs of the memory cell arrays MCAL and MCAR. However, the signal DCREF is inactive (LOW) in the data writing and the memory-cell MC refresh operation. In this case, only one of the control signals FBL and FBR is activated to HIGH, and one of the transfer gates TGL2 and TGR2 becomes "on", following the row address signals A8R and BA8R. As a result, the sense amplifier S/A can write or write back data to the memory cell MC of either the memory cell array MCAL or MCAR.

The operation of the FBC memory device is explained next.

Figure 12:
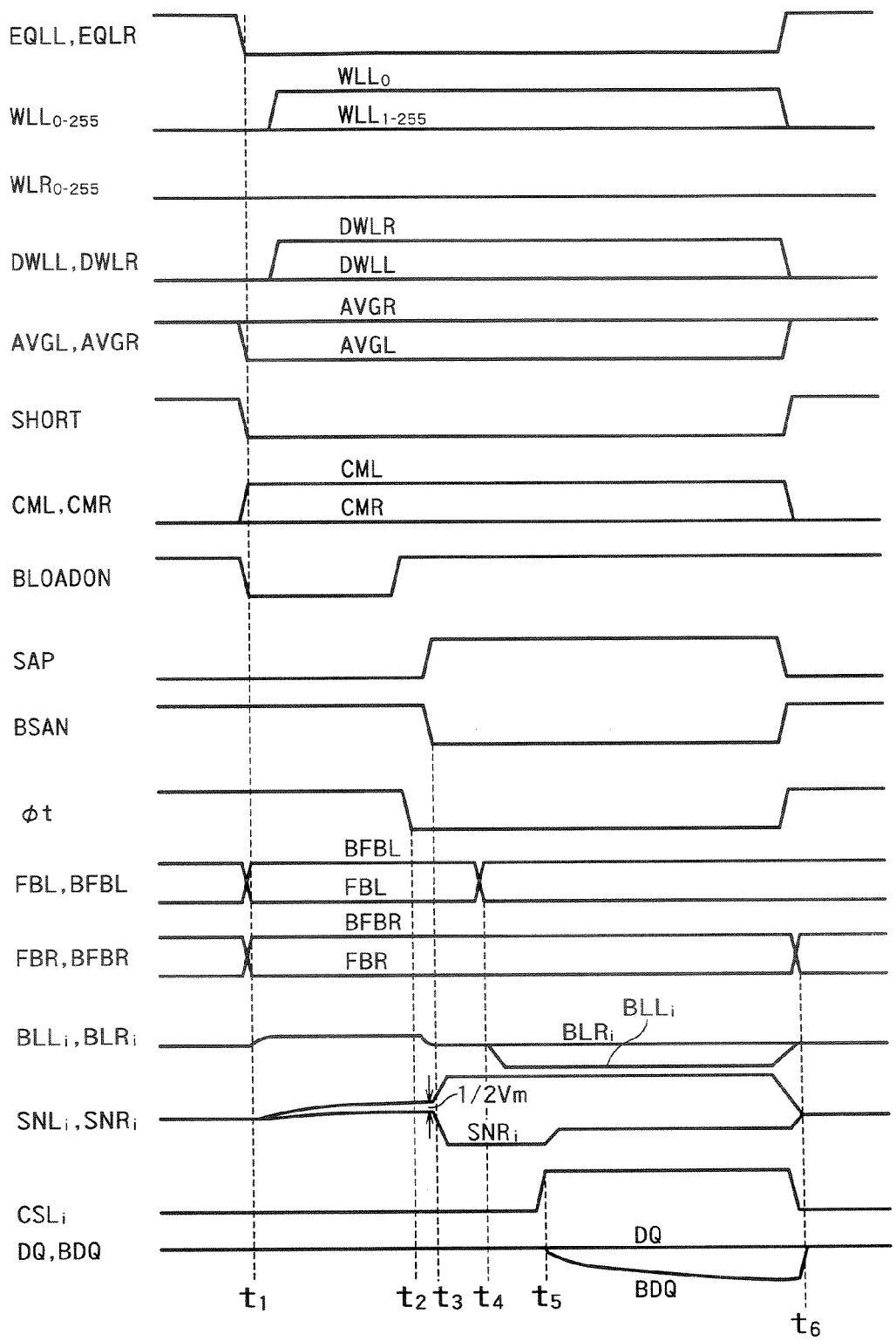
FIG. 12 is a timing chart showing the operation of reading data from the memory cell MC to the outside.

FIG. 12 is a timing chart showing the operation of reading data from the memory cell MC to the outside. During data reading, the sense nodes SNL and SNR are connected to the bit line BLL and the bit line BLR via the transfer gates TGL1 and TGR1, respectively. The transfer gates TGL2 and TGR2 are in the off state, the bit lines BLR and BLL are not connected to the sense nodes SNL and SNR, respectively.

In the present embodiment, the word line WLL0 is assumed to be activated. A current based on data on the bit line BLL flows to the bit line BLL, and a reference current flows to the bit line BLR. In other words, the sense amplifier S/A is connected to the memory cell MC via the bit line BLL, and is connected to the dummy cell DC via the bit line BLR. As a result, the sense amplifier S/A detects data of the memory cell MC connected to the bit line BLL.

At t1, the signals EQLL and EQLR are set LOW, thereby closing the equalizing transistors TEQL and TEQR shown in FIG. 1. As a result, the bit lines BLLi and BLRi short-circuited to the ground (VSL) are all set to a high-impedance state. At the same time, the signal SHORT is set LOW to disconnect the sense node SNLi from the sense node SNRi. Further, at t1, the signal AVGL falls to LOW, and the averaging transistor TAVL shown in FIG. 1 is set to the off state. As a result, the bit lines BLLI within the memory cell array MCAL are mutually separated. On the other hand, because the signal AVGR maintains HIGH, the averaging transistor TAVR is in the on state. As a result, the bit line BLRi within the memory cell array MCAR is kept connected.

Because the signal CML becomes HIGH, the transistor TP7 is turned off. Because the signal CMR remains LOW, the transistor TP8 is in the on state, and the sense node SNRi is connected to the gate of the transistor TP6.

When the signals FBL, FBR become LOW, the transfer gates TGL2, TGR2 are turned off. As a result, the bit line BLLi and the sense node SNRi are disconnected each other, and the bit line BLRi and the sense node SNLi are also disconnected each other. However, because the signal Φt is HIGH, the bit line BLLi and the sense node SNLi maintain the connection each other, and the bit line BLR1 and the sense node SNRi also maintain the connection each other.

Immediately after t1, the signal BLOADON becomes LOW, and the current mirror flows load currents on the sense nodes SNLi and SNRi to pass current to the memory cell MC and the dummy cells DCs via the sense nodes SNLi, SNRi and the bit lines BLLi, BLRi from the power supply VBLH. Since a threshold voltage of the memory cell MC is different from the average of threshold voltages of the dummy cells DCs (DC0 and DC1), the current and the potential on the sense node SNLi differs from the reference current and the reference potential on the sense node SNRi. As a result, a potential difference (a signal difference) appears between the pair of sense nodes SNLi and SNRi.

When the potential of this signal exceeds a certain value (t2), the signal Φt is set to LOW. As a result, the bit lines BLLi, BLRi and the sense nodes SNLi, SNRi are disconnected.

Next, at t3, the signals SAP and BSAN are activated. As a result, the latch circuits LC1 and LC2 amplify signal transmitted to the sense nodes SNLi and SNRi, and latch the potential between the power supplies VBLH and VBLL. In this case, VBLL is a bit potential at a low level necessary to write data "0" into the memory cell MC.

At t4, the signal FBL is activated to HIGH, and the transfer gate TGL2 becomes "on". As a result, data read at ti to t3 and latched by the latch circuits LC1 and LC2 are written back to the memory cell MC via the bit line BLLi.

At t5, the column signal CSLi is activated to HIGH. As a result, the transistors TN4, TN5 shown in FIG. 3 become in the on state, and the sense nodes SNLi and SNRi are short-circuited by the DQ buffer. Because the DQ line and the BDQ line are precharged to a high level, charge is gradually discharged from the DQ line or the BDQ line by this short-circuiting. As a result, data is transmitted to the DQ buffer. Further, data is output to the outside via an I/O pad connected to the DQ buffer.

At t6, the FBC memory device returns to a precharge state.

Figure 13:
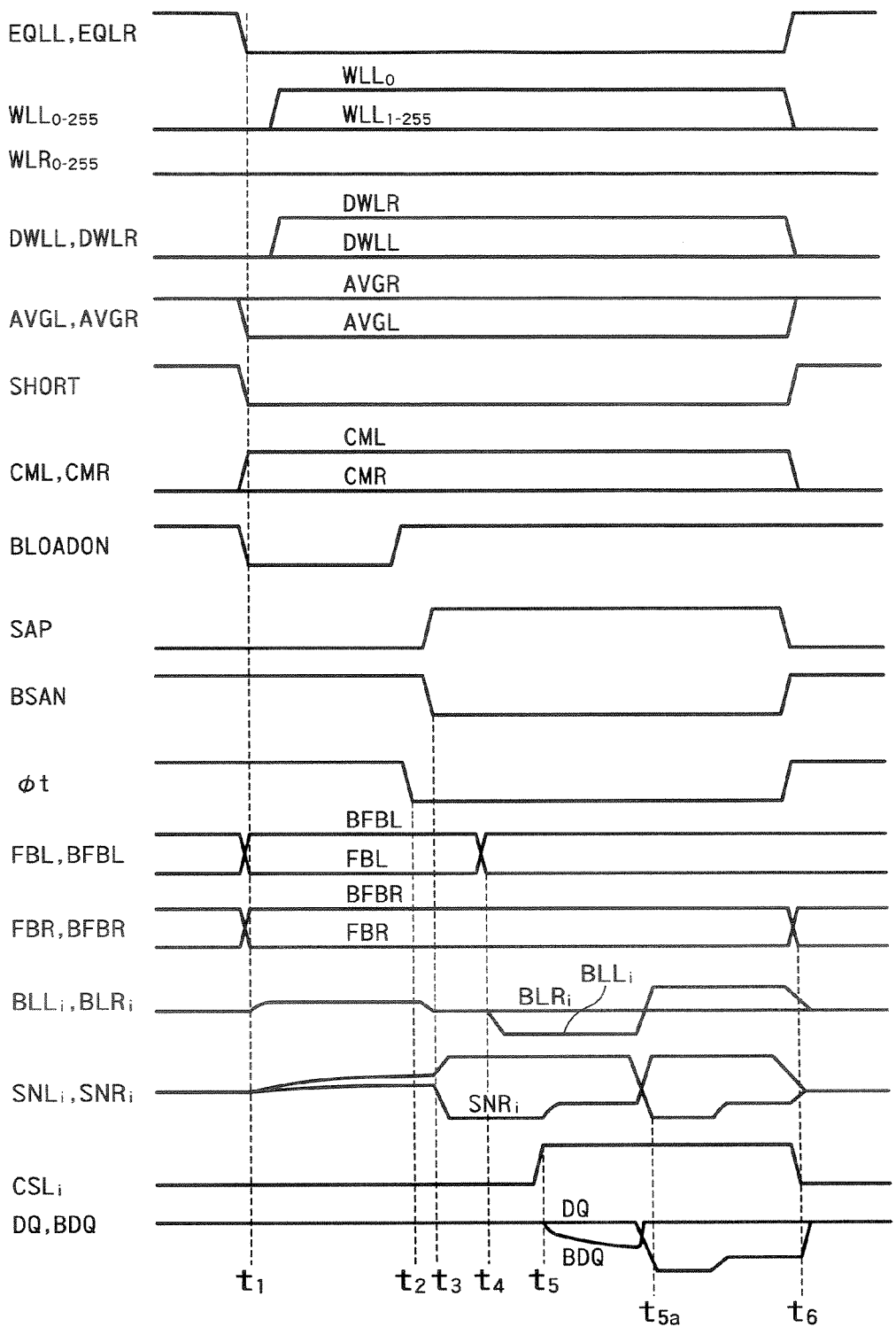
FIG. 13 is a timing chart showing the operation of writing data from the outside into the memory cell MC.

FIG. 13 is a timing chart showing the operation of writing data from the outside into the memory cell MC. During data writing, the sense node SNR is connected to the bit line BLL via the transfer gate TGL2, thereby writing data into the memory cell MC. The sense node SNL is connected to the bit line BLR via the transfer gate TGR1, thereby writing data into the memory cell MC. During data writing, the transfer gates TGL1 and TGR1 are in the off state, and the bit lines BLL and BLR are not connected to the sense nodes SNR and SNL.

The operation from t1 to t5 is similar to that of the above data reading operation. Thereafter, in the data writing operation, at t5a, data of the opposite polarity to that of the read data is supposed to be transmitted from the outside to the DQ line and the BDQ line. As a result, data polarities of the sense nodes SNLi, SNRi and the bit lines BLLi, BLRi are inverted, and data of the opposite polarity to that of the data stored in the memory cell MC can be written into this memory cell MC.

Figure 14:
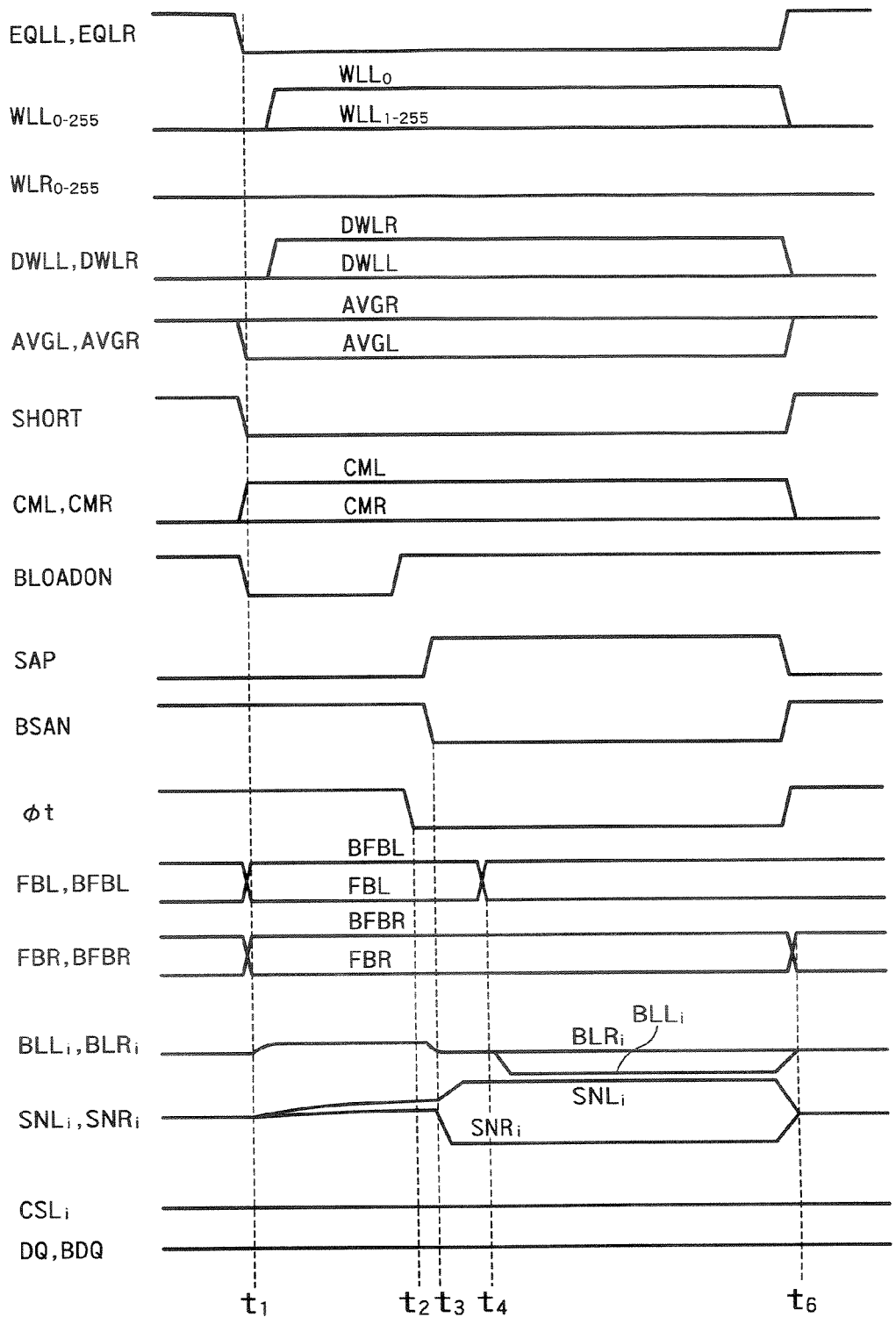
FIG. 14 is a timing chart showing a memory-cell MC refresh operation.

FIG. 14 is a timing chart showing a memory-cell MC refresh operation. The memory-cell MC refresh operation is different from the data reading operation shown in FIG. 12 in the point that the column signal CSLi maintains LOW. As a result, no signal is transmitted to the DQ line and the BDQ line, and no data is output to the outside. The operation of other signals in the memory-cell MC refresh operation is the same as the data reading operation shown in FIG. 12.

Figure 15:
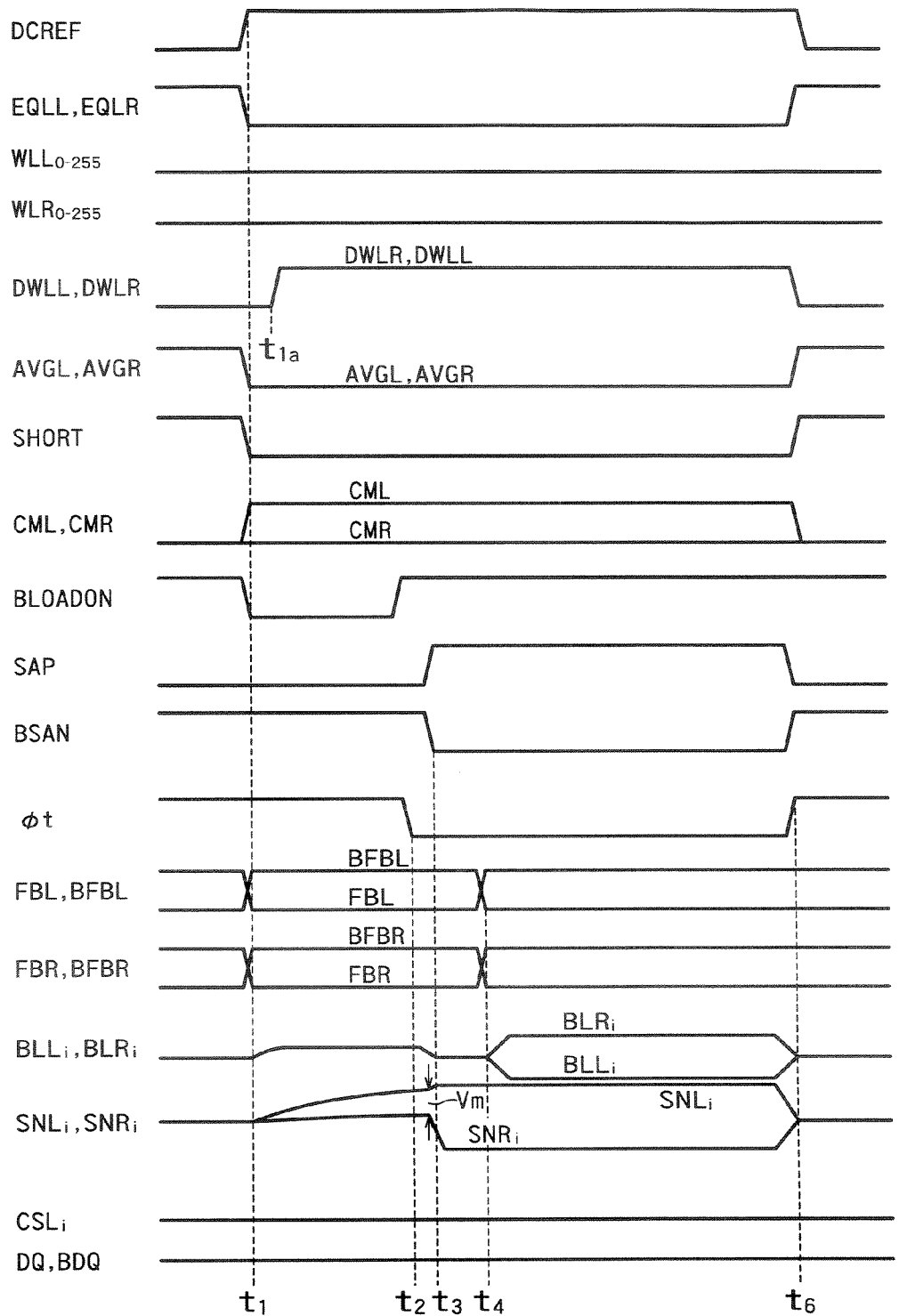
FIG. 15 is a timing chart showing the dummy-cell DC refresh operation.

FIG. 15 is a timing chart showing the dummy-cell DC refresh operation. In FIG. 12 to FIG. 14, the signal DCREF is in the inactive (LOW) state (not shown). However, in the dummy cell refresh operation, the dummy cell refresh signal DCREF is activated to HIGH at t1. As a result, as explained with reference to FIG. 5, the word lines WLLi, WLRi are not activated. On the other hand, as explained with reference to FIG. 7, both the dummy word lines DWLL and DWLR are activated (t1a). As explained with reference to FIG. 8, both the averaging signals AVGL and AVGR fall to LOW. As a result, the bit lines BLLi and BLRi are mutually separated.

As explained with reference to FIG. 9, any one of the signals CML and CMR can be started without out problem. In other words, a gate potential of the transistors TP5, TP6 that constitute the current mirror can be any one of the potentials of SNLi and SNRi. In the present embodiment, when CML becomes HIGH, the gates of the transistors TP5, TP6 are connected to the sense node SNRi. In other words, a potential of the sense node SNLi is detected, using the potential of the sense node SNRi as a reference potential.

At t1, the transfer gates TGL2, TGR2 are turned off. The transfer gates TGL1 and TGR1 maintain the on state. Immediately after t1, the load signal BLOADON is activated, and a load current flows from the current mirror circuit to the two dummy cells DC0 and DC1 located at the left and right positions of the sense amplifier S/A via the sense nodes SNLi, SNRi and the bit lines BLLi, BLR1.

In this case, attention should be paid to a difference between potentials of currents transmitted to the sense nodes SNLi and SNR1. As shown in FIG. 12, usually, when data of the memory cell MC is read out, a difference between the potentials of signals transmitted to the sense nodes SNL1 and SNRi is (½)Vm. On the other hand, in the dummy-cell DC refresh operation, a difference between the potentials of signals transmitted to the sense nodes SNLi and SNRi is Vm, In other words, a margin of the signal potential difference at the time of reading data in the dummy-cell DC refresh operation is approximately twice of a normal margin of the signal potential difference at the time of reading data from the memory cell MC.

As explained above, the margin of the signal potential difference increases for the following reason. A current that flows to the memory cell MC of the data "0" is supposed to be I0, and a current that flows to the memory cell MC of data "1" is supposed to be I1. Conventionally, at the time of reading data from the memory cell MC, an intermediate potential between a potential generated in the sense node by data "0" and a potential generated in the sense node by data "1" is set as a reference potential. In other words, a potential, which is generated when the sense amplifier S/A passes a reference current Iref=(I1+I0)/2 flowing from the current mirror to the dummy cells DC0 and DC1, is the reference potential. Thereby, the sense amplifier S/A detects data by using the potential appearing in the sense node.

On the other hand, according to the present embodiment, in the reading of a dummy cell DC, data "0" becomes a reference for data "1", and data "1" becomes a reference for data "0". In other words, at the time of detecting data "1", a reference current Iref=I0 that flows from the current mirror based on the potential of data "0" is passed to the memory cell MC, thereby detecting data based on the potential appearing in the sense node. At the time of detecting data "0", a reference current Iref=I1 that flows from the current mirror based on the potential of data "1" is passed to the memory cell MC, thereby detecting data based on the potential appearing in the sense node. Therefore, a potential difference of signals becomes large.

At time t3, the signals SAP, BSAN are activated, thereby operating the latch circuits LC1 and LC2. As a result, data is latched by the sense nodes SNLi and SNRi.

At t4, both the signals FBL and GBR are activated to HIGH. As a result, both the transfer gates TGL2 and TGR2 become on, and data is simultaneously written back to two dummy cells located at both sides of the sense amplifier S/A.

In the present embodiment, the dummy cells DC1 and DC0 are alternately laid out along the dummy word lines DWLL, DWLR, as shown in FIG. 1. However, the dummy cells DC1 and DC0 can be alternately laid out by plural number along the dummy word lines DWLL, DWLR. For example, the dummy cells DC1 and DC0 can be alternately laid out by two, like "0", "0", "1", "1", "0", "0", "1", "1", . . . , along the dummy word lines DWLL, DWLR. The dummy cells DC1 and DC0 can be also alternately laid out by three, like "0", "0", "0", "1", "1", "1" . . . , along the dummy word lines DWLL, DWLR. However, the dummy cells located at the left and right sides of each sense amplifier S/A needs to have opposite polarities, as shown in FIG. 1.

<A System of Initial Writing into Dummy Cells>

Prior to the data writing/reading operation, data patterns of opposite polarities need to be alternately written into dummy cells along the dummy word lines as shown in FIG. 1. Usually, data needs to be written into dummy cells at the beginning of a power supply. A system of initial writing into dummy cells is explained below.

According to this system, both the dummy word lines DWLL and DWLR are started, and signals of opposite polarities are alternately written into these dummy word lines for each bit line via the pair of DQ and BDQ lines. In this case, the sense amplifier S/A is operating to temporarily store signals. However, writing opposite data for each bit line requires write cycles by the number of the bit lines, and it is not necessarily efficient.

When plural column selection lines CSLi can be simultaneously risen in the dummy-cell write cycle, efficiency increases by the number of the column selection lines CSLi simultaneously risen. However, data "0" and "1" cannot be written at the same time. Therefore, at least two cycles are necessary.

When the number of pairs of a DQ line and a BDQ line is increased to two or more, data "0" and "1" can be written simultaneously. In this case, desired data patterns can be also written into dummy cells in one cycle.

Figure 16:
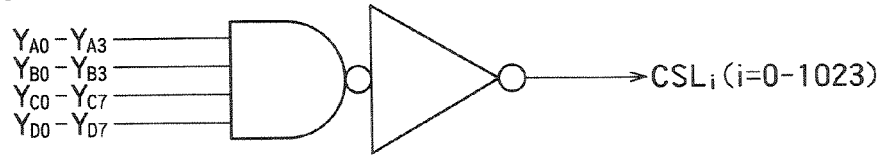
FIG. 16 is a circuit diagram of a column decoder of an FBC memory device that executes the system of writing data into dummy cells.
Figure 17A:
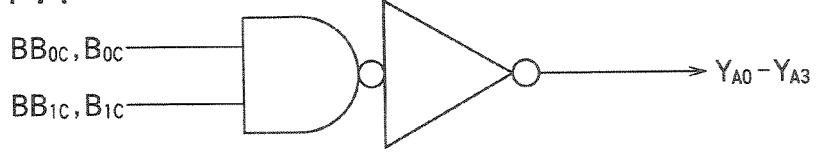
FIG. 17A to FIG. 17D are circuit diagrams of a column predecoder of the FBC memory device that executes the system of writing data into dummy cells.
Figure 17B:
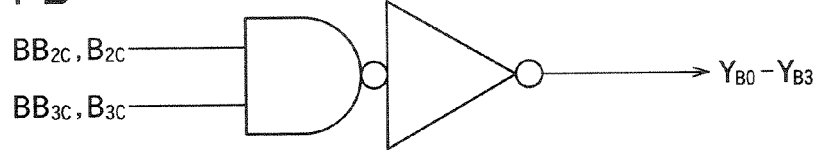
Figure 17C:
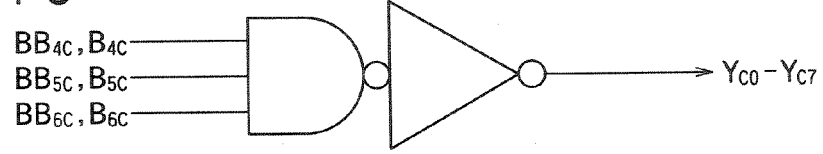
Figure 17D:
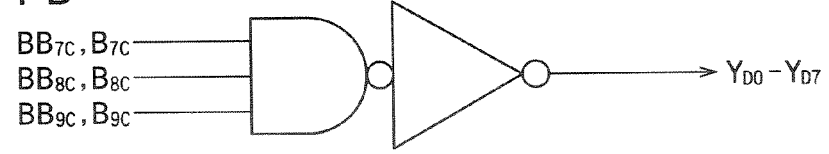

FIG. 16 is a circuit diagram of a column decoder of an FBC memory device that executes the scheme of writing data into dummy cells. This column decoder inputs any one of signals of predecoded column addresses YA0 to YA3, any one of signals of predecoded column addresses YB0 to YB3, any one of signals of predecoded column addresses YC0 to YC7, and any one of signals of predecoded column addresses YD0 to YD7, and executes their NAND operation. An inversion signal as a result of the NAND operation is transmitted to the column selection line CLSi as a column selection signal. This column decoder has a selection capacity of 4×4×8×8=1024 ways.

FIG. 17A to FIG. 17D are circuit diagrams of a column predecoder of the FBC memory device that executes the scheme of writing data into dummy cells. The column predecoder predecodes column addresses BBiC, BiC, thereby converting the column addresses BBiC, BiC into the above column addresses YA0 to YA3, YB0 to YB3, YC0 to YC7, and YD0 to YD7.

Figure 18A:
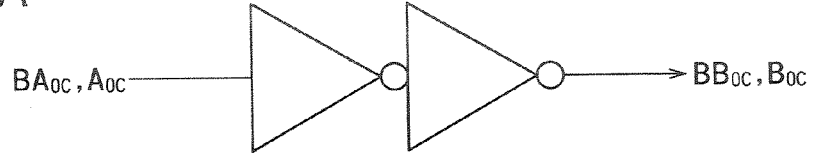
FIG. 18A and FIG. 18B are circuit diagrams of a column predecoder of the FBC memory device that executes the system of writing data into dummy cells.
Figure 18B:
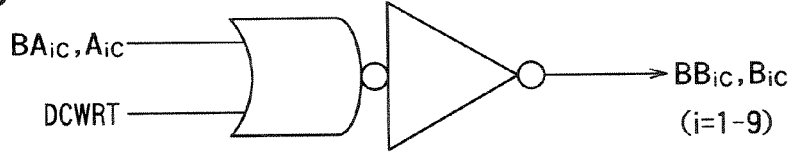

FIG. 18A and FIG. 18B are circuit diagrams of a column address converter of the FBC memory device that executes the scheme of writing data into dummy cells. This column address converter is connected to between a column address input buffer (not shown) and the column pre-decoder shown in FIG. 17. The column address converter shown in FIG. 18A converts column address signals A0C and BA0C into column address signals B0C and BB0C. The column address converter shown in FIG. 18B converts column address signals AiC and BAiC (where i=1 to 9) into column address signals BiC and BBiC (where i=1 to 9).

The column address converter shown in FIG. 18A converts column addresses, regardless of a dummy cell refresh signal DCWRT. On the other hand, the column address converter shown in FIG. 18B sets all the column address signals BiC and BBiC to HIGH, regardless of the column address signals AiC and BAiC, when the dummy cell refresh signal DCWRT is activated to HIGH. In other words, in a dummy-cell DC refresh operation, while the column address signals B0C and BB0C operate, the column address signals BiC and BBiC are fixed. The column address signals B0C and BB0C are predecoded to the column addresses YA0 to YA3, to select any one of a column selection line having an even i or a column selection line having an odd i. For example, when B0C is LOW, an even column selection line CSLi (i=2x) is risen, and when B0C is HIGH, an odd column selection line CSLi (i=2x+1) is risen, where x is an integer. Accordingly, in the dummy-cell DC refresh operation, data "0" can be written into the dummy cell DC by selecting the even bit lines BLLi, BLRi (i=2x), and next, data "1" can be written into the dummy cell DC by selecting the odd bit lines BLLi, BLR1 (i=2x+1). As a result, the dummy cells DC0, DC1 can be alternately laid out along the dummy word lines DWL, DWR, as shown in FIG. 1.

Figure 19:
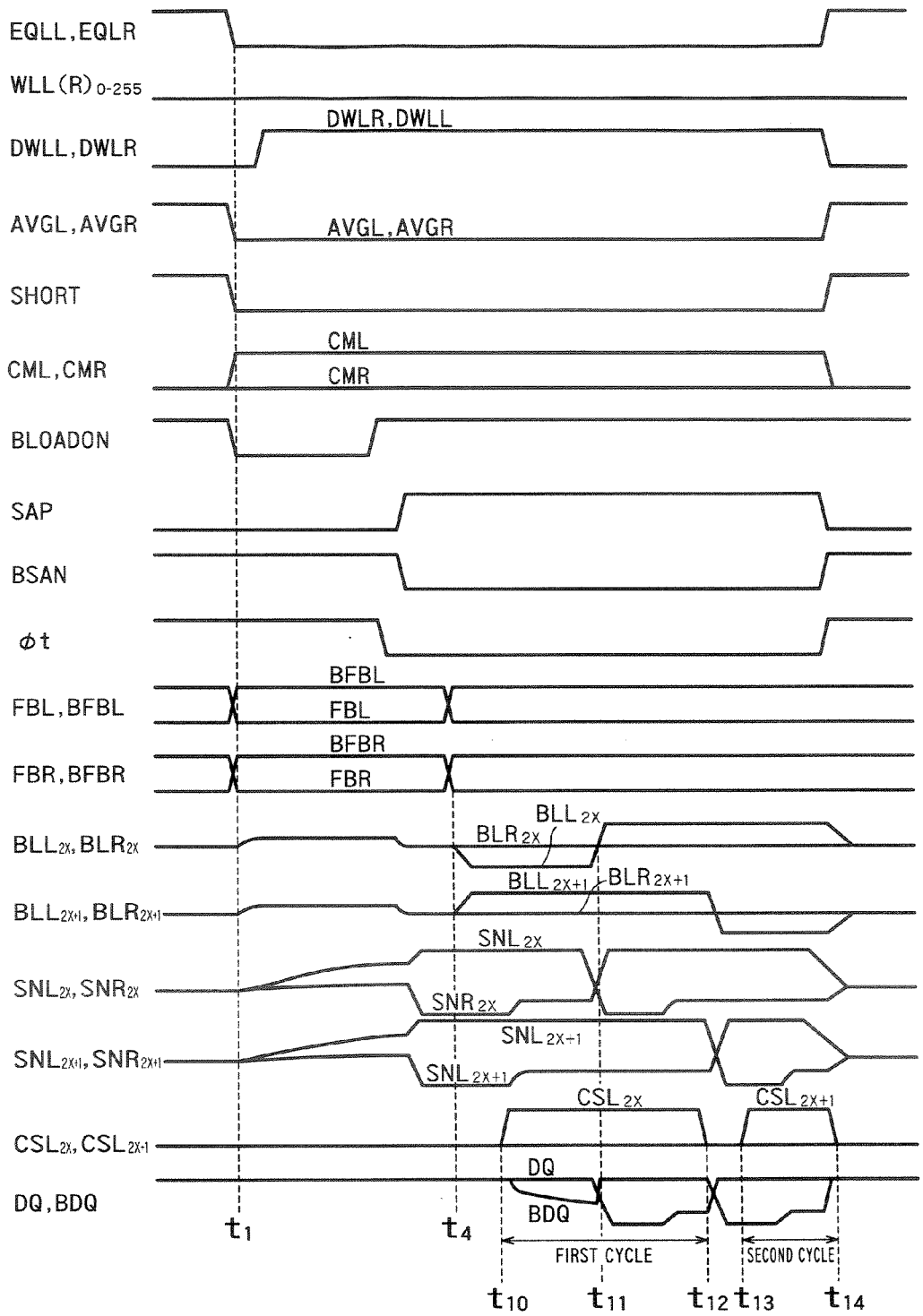
FIG. 19 is a timing chart of the system of initial writing into dummy cells.

FIG. 19 is a timing chart of the system of initial writing into dummy cells. This system includes two selection cycles of a selection cycle (a first cycle) of the column selection line CSLi (i=2x), and a selection cycle (a second cycle) of the column selection line CSLi (i=2x+1).

The operation at t1 to t4 can be similar to the dummy-cell DC refresh operation during a period from t1 to t4 in FIG. 15. In the initial writing, data read from the dummy cell is an undecided one of data "0" or data "1".

At t10, an even column selection line CSLi (i=2x) is risen to HIGH. As a result, an even sense node is connected to the DQ line and the BDQ line.

At t11, a potential is given to the bit line BLLI (i=2x) from the outside via the DQ and BDQ lines. In the present embodiment, a potential of a HIGH level is given to the bit line BLLi (i=2x). As a result, data "1" is written into the dummy cell DC connected to the even bit line BLLI (i=2x). This dummy cell DC becomes DC1 shown in FIG. 1.

At t12, the column selection line CSLi (i=2x) is fallen to LOW. A period from t10 to t12 is a first selection cycle.

At t13, the odd column selection line CSLi (i=2x+1) is risen to HIGH. As a result, an odd sense node is connected to the DQ line and the BDQ line. A potential is given to the bit line BLLi (i=2x+1) from the outside via the DQ and BDQ lines. In the present embodiment, a potential of a LOW level is given to the bit line BLLI (i=2x+1). As a result, data "0" is written into the dummy cell DC connected to the even bit line BLLi (i=2x+1). This dummy cell DC becomes DC0 shown in FIG. 1. The column selection line CSLi (i=2x+1) is started at t14. A period from t13 to t14 is a second selection cycle.

The initial writing into dummy cells can be automatically carried out without involving user's consciousness, by providing an exclusive circuit within a memory device. Therefore, it is advantageous to incorporate a data setting circuit (not shown) that gives LOW data to the DQ line at till to t12, and gives HIGH data to the DQ line at t13 to t14.

In the present embodiment, a write circuit exclusive for a dummy cell DC is not necessary, and the whole device can be easily made compact.

Second Embodiment

In a second embodiment, a potential asymmetry is given to sense node pairs, by applying a potential of a predetermined polarity to the sense nodes. As a result, data of a predetermined polarity can be simultaneously written into the dummy cell pairs, or the dummy cells can be refreshed.

Figure 20:
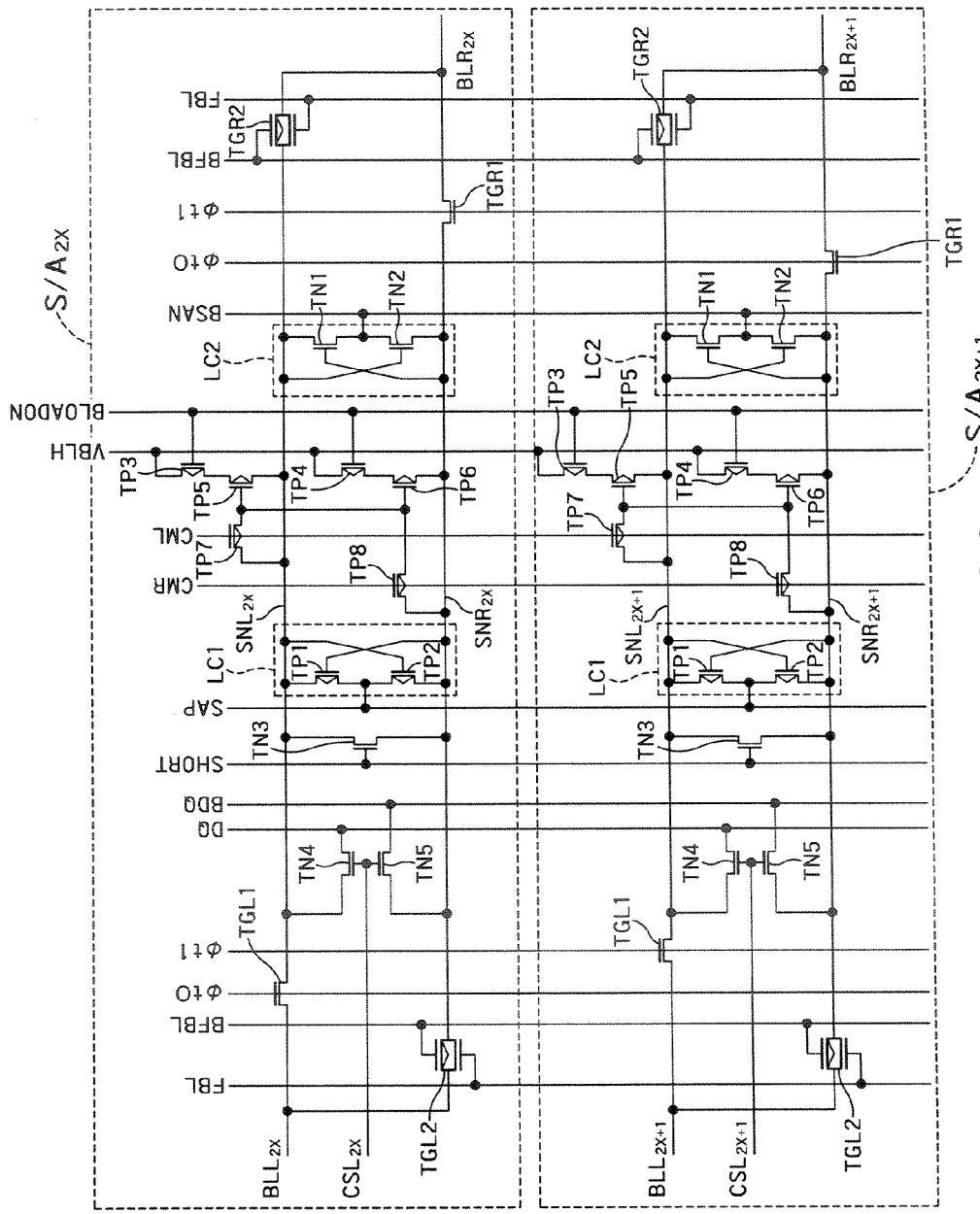
FIG. 20 is a circuit diagram of a sense amplifier S/A according to the second embodiment of the present invention.

FIG. 20 is a circuit diagram of a sense amplifier S/A according to the second embodiment of the present invention. A total configuration of the device is similar to that shown in FIG. 1. In the second embodiment, the sense amplifier S/A receives signals of two systems of signals Φt1 and Φt0 to control the transfer gates TGL1, TGR1. The signal Φt0 is used in the transfer gate TGL1 of an even sense amplifier S/Ai (i=2x), and in the transfer gate TGR1 of an odd sense amplifier S/Ai (i=2x+1). The signal Φt1 is used in the transfer gate TGL1 of an odd sense amplifier S/Ai (i=2x+1), and in the transfer gate TGR1 of an even sense amplifier S/Ai (i=2x). The signals Φt1 and Φt0 are used to control the transfer gates TGL1, TGR1.

In other words, a first transfer gate TGL1 included in the odd sense amplifier is controlled by the control signal Φt1. The transfer gate TGL1 is provided at a side of the memory cell array MCAL. A second transfer gate TGR1 included in the odd sense amplifier is controlled by the control signal Φt0. The transfer gate TGR1 is provided at a side of the memory cell array MCAR.

A first transfer gate TGL1 included in the even sense amplifier is controlled by the control signal Φt0. The transfer gate TGL1 is provided at a side of the memory cell array MCAL. A second transfer gate TGR1 included in the even sense amplifier is controlled by the control signal Φt1. The transfer gate TGR1 is provided at a side of the memory cell array MCAR.

Figure 21A:
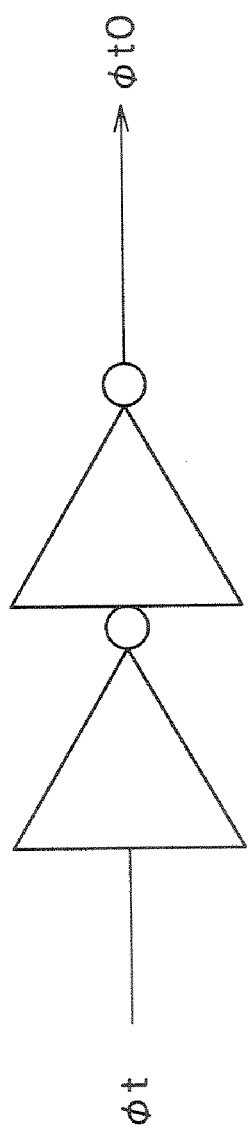
FIG. 21A and FIG. 21B are circuit diagrams of generators of the signals Φt1 and Φt0.
Figure 21B:
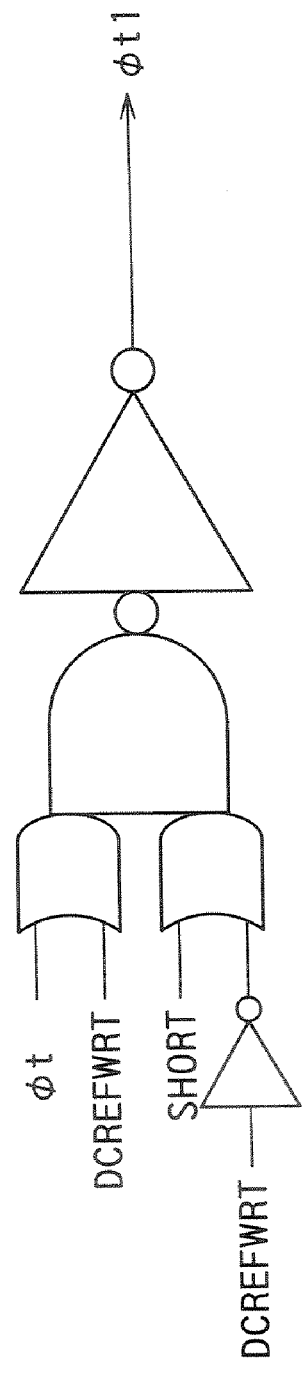

FIG. 21A and FIG. 21B are circuit diagrams of generators of the signals Φt1 and Φt0. As shown in FIG. 21A, the signal Φt0 is output straight as a signal Φt. A signal DCREFWRT shown in FIG. 21B works as both an initial writing signal of the dummy cell DC and a refresh signal of the dummy cell. In other words, the signal DCREFWRT is a signal that is activated to HIGH during the initial writing or during the refreshing of the dummy cell. The signal SHORT is a signal that controls the timing of outputting the signal Φt1.

In the initial writing operation and the dummy-cell DC refresh operation, when the signal DCREFWRT becomes active (HIGH), the signal Φt1 becomes HIGH at the timing when the signal SHORT is risen. In the memory-cell MC reading operation, the memory-cell MC writing operation, and the memory-cell MC refresh operation, when the signal DCREFWRT is active (LOW), the signal Φt1 is directly output as a signal Φt, like the signal Φt0.

Figure 22:
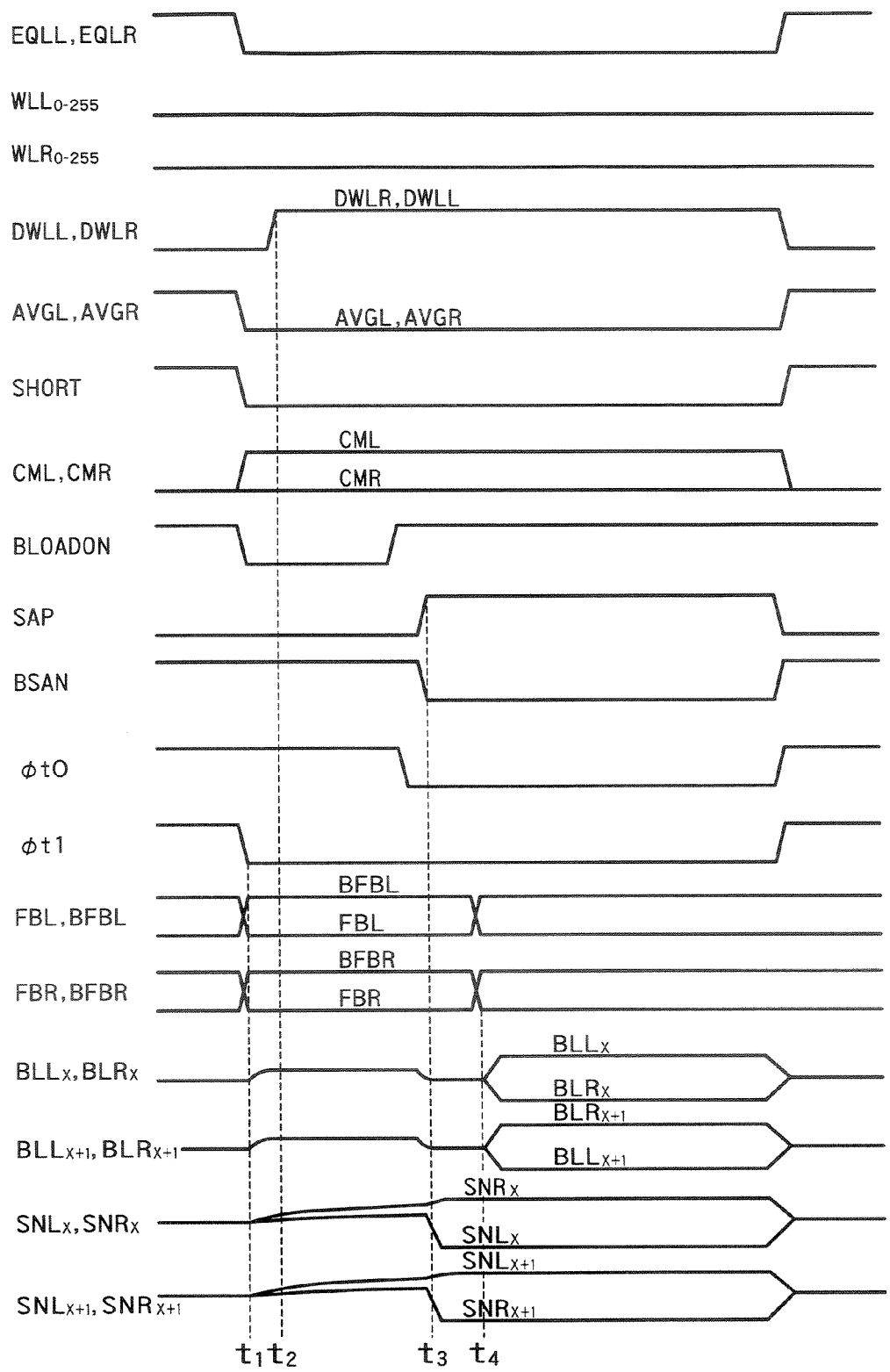
FIG. 22 is a timing chart showing the initial writing to the dummy cell DC in the second embodiment.

FIG. 22 is a timing chart showing the initial writing to the dummy cell DC in the second embodiment. First, at t1, the signal Φt1 becomes inactive (LOW). In this case, the signal Φt0 remains active (HIGH). As a result, the transfer gate TGL1 of the odd sense amplifier S/Ai (i=2x+1) and the transfer gate TGR1 of the even sense amplifier S/Ai (i=2x) become off. The transfer gate TGL1 of the even sense amplifier S/Ai (i=2x) and the transfer gate TGR1 of the odd sense amplifier S/Ai (i=2x1) maintain the on state.

The load signal BLOADON becomes active (LOW) at t1, and the dummy words line DWLL and DWLR are risen to HIGH at t2. In this case, a load current flows to the dummy cell DC via the sense node SNLi (i=2x) and the bit line BLLi (i=2x), and flows to the dummy cell DC via the sense node SNRi (i=2x+1) and the bit line BLRi (i=2x+1). On the other hand, no current flows to the sense node SNRi (i=2x) and the sense node SNLi (i=2x+1). As a result, potentials of the sense node SNLi (i=2x) and the sense node SNRi (i=2x+1) become lower than the potentials of the sense node SNRi (i=2x) and the sense node SNLi (i=2x+1).

As explained above, in the second embodiment, a potential of a predetermined polarity is applied to the sense node, thereby giving a potential asymmetry to the pair of the sense nodes SNLi and SNRi. As a result, the pair of the sense nodes SNLi and SNRi have potentials of mutually opposite polarities. A potential asymmetry is also given to the even SNLi (i=2x) and odd SNLi (i=2x+1). As a result, SNLi (i=2x) and SNLi (i=2x+1) have potentials of mutually opposite polarities. In other words, the pair of the sense nodes SNLi and SNRi are latched in opposite polarities per one sense amplifier.

Next, the signal Φ0 is made inactive (LOW), thereby turning off all the transfer gates TGL1 and TGR1. At t3, the signals SAP and BSAN are set active, thereby operating the latch circuits LC1 and LC2. As a result, the sense node SNLi (i=2x) and the sense node SNRI (i=2x+1) latch LOW (data "0"), and the sense node SNRi (i=2x) and the sense node SNLi (i=2x+1) latch HIGH (data "1"). At t4, the transfer gates TGL2 and TGR2 within all the sense amplifiers S/A are set on. As a result, data "0" and "1" are written into the dummy cells in the data pattern shown in FIG. 1.

According to the second embodiment, initial writing can be made into the dummy cells DC0 and DC1 in one cycle. The second embodiment can be applied to the dummy cell refresh operation as well as the writing into the dummy cells. In other words, in the dummy cell refresh operation, regardless of the data of the dummy cell DC, desired data can be forcibly written into the dummy cell with the potential asymmetry to the pair of sense nodes SNL1, SNRi, without amplifying the data of the dummy cell DC. Or the following dummy cell refresh operation can also be performed. At the dummy cell refresh operation, the sense amplifiers detect the data stored in the dummy cells DC0 using the data stored in the dummy cells DC1 as the reference data, or detects the data stored in the dummy cells DC1 using the data stored in the dummy cells DC0 as the reference data. The second embodiment also has the effect of the first embodiment.

While the above embodiment has the open-bit line configuration, the embodiment can be also applied to an FBC memory device having a folded bit line configuration.

The invention claimed is:

1. A semiconductor memory device comprising:
   memory cells including floating bodies in an electrically floating state and storing data based on the number of majority carriers within the floating bodies;
   a first dummy cell and a second dummy cell generating a reference data which becomes a data detection reference at the time of detecting the data of the memory cells and storing first data and second data of mutually opposite polarities, respectively;
   word lines connected to gates of the memory cells;
   a first dummy word line and a second dummy word line connected to a gate of the first dummy cell and a gate of the second dummy cell, respectively;
   a pair of bit lines connected to sources or drains of the memory cells; and
   a sense amplifier provided for the pair of bit lines, the sense amplifier detecting the first data using the second data as the reference data or detecting the second data using the first data as the reference data in a refresh operation of the first and the second dummy cells, the refresh operation being an operation in which data stored in the first or the second dummy cell is read, then the data is written back to the same dummy cell.

2. The semiconductor memory device according to claim 1, wherein the same number of the first dummy cells and the second dummy cells are alternately provided along the first and the second dummy word lines, and one of the first dummy cells and one of the second dummy cells are provided for the pair of bit lines.

3. The semiconductor memory device according to claim 1, wherein plurality of the first dummy cells and plurality of the second dummy cells are provided along the dummy word line.

4. The semiconductor memory device according to claim 1, further comprising:
- a word drive signal generator inactivating the word lines during the refresh operation of the first and the second dummy cells, the refresh operation of the first and the second dummy cells being an operation in which data stored in the first and the second dummy cells are read, then the data are written back to the same dummy cells; and
- a dummy word-line driver activating the first and the second dummy word lines during the refresh operation of the dummy cells.

5. The semiconductor memory device according to claim 4, wherein the dummy word-line driver inactivates one of the first and the second dummy word lines during data read operation, data write operation, and a refresh operation of the memory cells, the refresh operation of the memory cells being an operation in which data stored in the memory cells are read, then the data are written back to the same memory cell.

6. The semiconductor memory device according to claim 5, wherein the dummy word-line driver inactivates the dummy word lines and selects either the first or the second memory cell following an address signal during data read operation, data write operation, and a refresh operation of the memory cells, the refresh operation of the memory cells being an operation in which data stored in the memory cells are read, then the data are written back to the same dummy cell.

7. The semiconductor memory device according to claim 5, wherein
- the word drive signal generator includes a logic gate receiving a timing signal for determining a timing of driving one of the word lines, address signals showing an address of one of the word lines, and a dummy cell refresh signal activated during the refresh operation of the first and the second dummy cells,
- the word drive signal generator outputs an operation result of the address signals at the timing of activating the timing signal to select one of the word lines in a data read operation, in a data write operation, and in the refresh operation of the memory cells, and
- the word drive signal generator inactivates the word lines regardless of the timing signal and the address signal in the refresh operation of the first and the second dummy cells.

8. The semiconductor memory device according to claim 5, wherein
- a first and a second memory cell arrays each including a plurality of memory cells are provided at both sides of the sense amplifier, the first and the second memory cell arrays corresponds to the first and the second dummy cells, respectively,
- the dummy word-line driver includes a logic gate receiving an address signal for selecting the first or the second memory cell array, a dummy cell refresh signal activated during the refresh operation of the first and the second dummy cells, and a timing signal for determining a timing of driving the word line,
- the dummy word-line driver selects either the first or the second dummy word lines by the address signal at the timing of activating the timing signal to select either the first or the second dummy cell in a data read operation, in a data write operation, and in the refresh operation of the memory cells, and
- the dummy word-line driver selects both the first and the second dummy cells regardless of the timing signal and the address signal in the refresh operation of the first and the second dummy cells.

9. The semiconductor memory device according to claim 4, wherein the dummy word-line driver inactivates the dummy word lines and selects either a first or a second memory cell following an address signal during data read operation, data write operation, and a refresh operation of the memory cells, the refresh operation of the memory cells being an operation in which data stored in the memory cells are read, then the data are written back to the same memory cell.

10. The semiconductor memory device according to claim 9, wherein
- the word drive signal generator includes a logic gate receiving a timing signal for determining a timing of driving one of the word lines, address signals showing an address of one of the word lines, and a dummy cell refresh signal activated during the refresh operation of the first and the second dummy cells,
- the word drive signal generator outputs an operation result of the address signals at the timing of activating the timing signal to select one of the word lines in a data read operation, in a data write operation, and in the refresh operation of the memory cells, and
- the word drive signal generator inactivates the word lines regardless of the timing signal and the address signal in the refresh operation of the first and the second dummy cells.

11. The semiconductor memory device according to claim 9, wherein
- a first and a second memory cell arrays each including a plurality of memory cells are provided at both sides of the sense amplifier, the first and the second memory cell arrays corresponds to the first and the second dummy cells, respectively,
- the dummy word-line driver includes a logic gate receiving an address signal for selecting the first or the second memory cell array, a dummy cell refresh signal activated during the refresh operation of the first and the second dummy cells, and a timing signal for determining a timing of driving the word line,
- the dummy word-line driver selects either the first or the second dummy word lines by the address signal at the timing of activating the timing signal to select either the first or the second dummy cell in a data read operation, in a data write operation, and in the refresh operation of the memory cells, and
- the dummy word-line driver selects both the first and the second dummy cells regardless of the timing signal and the address signal in the refresh operation of the first and the second dummy cells.

12. The semiconductor memory device according to claim 4, wherein
- the word drive signal generator includes a logic gate receiving a timing signal for determining a timing of driving one of the word lines, address signals showing an address of one of the word lines, and a dummy cell refresh signal activated during the refresh operation of the first and the second dummy cells,
- the word drive signal generator outputs an operation result of the address signals at the timing of activating the timing signal to select one of the word lines in a data read operation, in a data write operation, and in the refresh operation of the memory cells, and
- the word drive signal generator inactivates the word lines regardless of the timing signal and the address signal in the refresh operation of the first and the second dummy cells.

13. The semiconductor memory device according to claim 4, wherein a first and a second memory cell arrays each including a plurality of memory cells are provided at both sides of the sense amplifier, the first and the second memory cell arrays corresponds to the first and the second dummy cells, respectively, the dummy word-line driver includes a logic gate receiving an address signal for selecting the first or the second memory cell array a dummy cell refresh signal activated during the refresh operation of the first and the second dummy cells, and a timing signal for determining a timing of driving the word line, the dummy word-line driver selects either the first or the second dummy word lines by the address signal at the timing of activating the timing signal to select either the first or the second dummy cell in a data read operation, in a data write operation, and in the refresh operation of the memory cells, and the dummy word-line driver selects both the first and the second dummy cells regardless of the timing signal and the address signal in the refresh operation of the first and the second dummy cells.

14. The semiconductor memory device according to claim 1, wherein at the time of writing the first and the second data into the first and the second dummy cells, the sense amplifier writes the first data into even dummy cells along the dummy word line and then writes the second data into odd dummy cells, or the sense amplifier writes the first data into odd dummy cells along the dummy word lines and then writes the second data into even dummy cells.

15. A semiconductor memory device comprising:

memory cells including floating bodies in an electrically floating state and storing data based on the number of majority carriers within the floating bodies;

a first dummy cell and a second dummy cell generating a reference current which becomes a data detection reference at the time of detecting the data of the memory cells and storing first data and second data of mutually opposite polarities, respectively;

word lines connected to gates of the memory cells;

a first dummy word line and a second dummy word line connected to a gate of the first dummy cell and a gate of the second dummy cell, respectively;

a pair of bit lines connected to sources or drains of the memory cells;

a first sense amplifier provided for the pair of bit lines and sensing data of one of the memory cells;

a pair of sense nodes provided within the first sense amplifier; and two transfer gates provided between the pair of sense nodes and the pair of bit lines and controlled by different signals, wherein at the time of writing the first and the second data into the first and the second dummy cells or at the time of a refresh operation of the first and the second dummy cells, one of the two transfer gates becomes off and the other transfer gate becomes on, for setting potentials of the pair of sense nodes asymmetrical, and the first sense amplifier simultaneously writes the first data and the second data into the first dummy cell and the second dummy cell, respectively, using a difference between potentials of the pair of sense nodes.

16. The semiconductor memory device according to claim 15 further comprising:

a first and a second memory cell arrays each including a plurality of memory cells and provided at both sides of the sense amplifier; and a second sense amplifier between the first memory cell array and the second memory cell array, the second sense amplifier being provided for a second pair of bit lines and sensing data of one of the memory cells using the first data or the second data, wherein a first transfer gate of the transfer gates included in the first sense amplifier is controlled by the first control signal, a first transfer gate being provided on the first memory cell array side, a second transfer gate of the transfer gates included in the first sense amplifier is controlled by the second control signal, the second transfer gate being provided the second memory cell array side, a third transfer gate of the transfer gates included in the second sense amplifier is controlled by the second control signal, the third transfer gate being provided on the first memory cell array side, and a fourth transfer gate of the transfer gates included in the second sense amplifier is controlled by the first control signal, the fourth transfer gate being provided on the second memory cell array side.

* * * * *